US012805204B2

(12) United States Patent
Gupta et al.

(10) Patent No.: US 12,805,204 B2
(45) Date of Patent: Nov. 17, 2026

(54) SUPERCONDUCTING DIODES

(71) Applicant: Regents of the University of Minnesota, Minneapolis, MN (US)

(72) Inventors: Mohit Gupta, Minneapolis, MN (US); Vlad Stefan Pribiag, Eden Prairie, MN (US); Gino Vincent Graziano, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 660 days.

(21) Appl. No.: 18/335,417

(22) Filed: Jun. 15, 2023

(65) Prior Publication Data

US 2023/0413688 A1 Dec. 21, 2023

Related U.S. Application Data

(60) Provisional application No. 63/366,424, filed on Jun. 15, 2022.

(51) Int. Cl.

| | |
|---|---|
| ***H10N 60/10*** | (2023.01) |
| ***H10N 60/01*** | (2023.01) |
| ***H10N 60/12*** | (2023.01) |
| ***H10N 60/80*** | (2023.01) |
| ***H10N 60/85*** | (2023.01) |

(52) U.S. Cl.

CPC ....... *H10N 60/128* (2023.02); *H10N 60/0912* (2023.02); *H10N 60/12* (2023.02); *H10N 60/805* (2023.02); *H10N 60/85* (2023.02)

(58) Field of Classification Search

CPC ... H10N 60/128; H10N 60/0912; H10N 60/12

See application file for complete search history.

(56) References Cited

PUBLICATIONS

Graziano et al. "Transport studies in a gate-tunable three-terminal Josephson junction," Phys. Rev. B 101, 054510—Published Feb. 24, 2020 DOI: https://doi.org/10.1103/PhysRevB.101.054510 (Year: 2020).*

Graziano et al "Selective Control of Conductance Modes in Multi-terminal Josephson Junctions," arXiv:2201.01373v1 Jan. 4, 2022. (Year: 2022).*

Ando et al., "Observation of Superconducting Diode Effect," Nature, vol. 584, Aug. 20, 2020, pp. 373-376.

Arnault et al., "Dynamical stabilization of Multiplet Supercurrents in Multi-terminal Josephson Junctions," Nano Letters, vol. 22, No. 17, Aug. 23, 2022, 14 pp.

Arnault et al., "The Multi-Terminal Inverse AC Josephson Effect," Nano Letters, vol. 21, No. 22, Nov. 15, 2021, 11 pp.

(Continued)

*Primary Examiner* — Matthew L Reames

(74) *Attorney, Agent, or Firm* — Shumaker & Sieffert, P.A.

(57) ABSTRACT

A device may include a Josephson junction between at least three terminals. The device is configured to exhibit a superconducting diode effect. A method may include forming a Josephson layer including three terminals defining a Josephson junction. The method may further include forming, over the Josephson layer, a gate layer including at least three gates. Each gate of the at least three gates extends across a respective channel between a respective terminal pair of the three terminals. The Josephson layer and gate layer are configured to exhibit a superconducting diode effect.

20 Claims, 16 Drawing Sheets

(56) References Cited

PUBLICATIONS

Baumgartner et al., "A Josephson Junction Supercurrent Diode," Nature Nanotechnology, Mar. 2021, 16 pp.
Baumgartner et al., "Effect of Rashba and Dresselhaus Spin—Orbit Coupling on Supercurrent Rectification and Magnetochiral Anisotropy of Ballistic Josephson Junctions," Journal of Physics: Condensed Matter, vol. 34, No. 15, Feb. 10, 2022, 10 pp.
Bauriedl et al., "Supercurrent Diode Effect and Magnetochiral Anisotropy in Few-Layer NbSe2," Nature Communications, vol. 13, No. 4266, Jul. 2022, 18 pp.
Brooks et al., "Protected Gates for Superconducting Qubits," Physical Review A, vol. 87, May 6, 2013, 26 pp.
Diez-Merida et al., "Magnetic Josephson Junctions and Superconducting Diodes in Magic Angle Twisted Bilayer Graphene," Physics, Oct. 3, 2021, 33 pp.
Doucot et al., "Physical Implementation of Protected Qubits," Reports on Progress in Physics, vol. 75, No. 7, Jun. 28, 2012, 21 pp.
Elfeky et al., "Local Control of Supercurrent Density in Epitaxial Planar Josephson Junctions," Nano Letters, vol. 21, No. 19, Sep. 27, 2021, 7 pp.
Eriksson et al., "Topological Transconductance Quantization in a Four-Terminal Josephson Junction," Physical Review B, vol. 95, Feb. 2017, 11 pp.
Fatemi et al., "Weyl Josephson Circuits," Physical Review Research, vol. 3, No. 1, Mar. 2021, 13 pp.
Fulton et al., "Quantum Interference Properties of Double Josephson Junctions," Physical Review B, vol. 6, No. 3, Aug. 1, 1972, pp. 855-875.
Gladchenko et al., "Superconducting Nanocircuits for Topologically Protected Qubits," Nature Physics, vol. 5, Nov. 30, 2008, pp. 48-53.
Goldman et al., "Meissner Effect and Vortex Penetration in Josephson Junctions," Physical Review, vol. 164, No. 2, Dec. 10, 1967, pp. 544-547.
Graziano et al., "Selective Control of Conductance Modes in Multi-terminal Josephson Junctions," Nature Communications, vol. 13, No. 5933, Oct. 2022, 8 pp.
Gupta et al., "Gate Tunable Superconducting Diode Effect in a Three-terminal Josephson Device," Nature Communications, vol. 14, No. 3078, May 29, 2023, 20 pp.
Gupta et al., "Superconducting Diode Effect in a Three-terminal Josephson Device," 10.48550/arXiv.2206.08471, Jun. 2022, 13 pp.
Harada et al., "Anomalous Magnetic Flux Periodicity of Supercurrent in Mesoscopic SNS Josephson Junctions," Physica C: Superconductivity, vol. 367, No. 1-4, Feb. 15, 2002, pp. 229-233.
Hoshino et al., "Nonreciprocal Charge Transport in Two-Dimensional Noncentrosymmetric Superconductors," Physical Review B, vol. 98, Aug. 20, 2018, 23 pp.
Hui et al., "Proximity-Induced Superconductivity and Josephson Critical Current in Quantum Spin Hall Systems," Physical Review B, vol. 90, No. 22, Dec. 18, 2014, 9 pp.
Kitaev, "Protected Qubit Based on a Superconducting Current Mirror," arXiv, Sep. 19, 2006, 6 pp.
Lee et al., "Contribution of Top Barrier Materials to High Mobility in Near-Surface InAs Quantum Wells Grown on GaSb(001)," Physical Review Materials, vol. 3, No. 1, Jan. 2019, 15 pp.
Meyer et al., "Non-Trivial Chern Numbers in Three-Terminal Josephson Junctions," Physical Review Letters, vol. 119, No. 13, Sep. 2017, 5 pp.
Paajaste et al., "Pb/InAs Nanowire Josephson Junction with High Critical Current and Magnetic Flux Focusing," Nano Letters, vol. 15, No. 3, Feb. 11, 2015, 6 pp.
Pankratova et al, "Multiterminal Josephson Effect," Physical Review X, vol. 10, No. 031051, Sep. 2020, 12 pp.
Peterson et al., "Analysis of Threshold Curves for Superconducting Interferometers," Journal of Applied Physics, vol. 50, No. 12, Dec. 1, 1979, pp. 8135-8142.
Pop et al., "Measurement of the Current-Phase Relation in Josephson Junction Rhombi Chains," Physical Review B, vol. 78, No. 104504, Sep. 9, 2008, 12 pp.
Rikken et al., "Electrical Magnetochiral Anisotropy," Physical Review Letters, vol. 87, No. 23, Jan. 2002, 5 pp.
Riwar et al., "Multi-Terminal Josephson Junctions as Topological Matter," Nature Communications, vol. 7, No. 11167, Apr. 4, 2016, 5 pp.
Shockley, "The Theory of p-n Junctions in Semiconductors and p-n Junction Transistors," The Bell System Technical Journal, vol. 28, No. 3, Jul. 1949, pp. 435-489.
Souto et al., "The Josephson Diode Effect in Supercurrent Interferometers," Physical Review Letters, vol. 129, Dec. 2022, 9 pp.
Strambini et al., The w-SQUIPT as a tool to phase-engineer Josephson topological materials, Nature Nanotechnology, vol. 11, Dec. 2016, pp. 1055-1059.
Suominen et al., "Anomalous Fraunhofer Interference in Epitaxial Superconductor-Semiconductor Josephson Junctions," Physical Review B, vol. 95, No. 3, Jan. 18, 2017, 26 pp.
Sze et al., "Chapter 3—p-n Junction," Semiconductor Devices: Physics and Technology, John Wiley and Sons, 2012 ((Applicant points out, in accordance with MPEP 609.04(a), that the year of publication, 2012, is sufficiently earlier than the effective U.S. filing date, so that the particular month of publication is not in issue.), 44 pp.
Wakatsuki et al., "Nonreciprocal Charge Transport in Noncentrosymmetric Superconductors," Science Advances, vol. 3, No. 4, Apr. 21, 2017, 9 pp.
Wu et al., "The Field-Free Josephson Diode in a Van der Waals Heterostructure," Nature, vol. 604, Apr. 28, 2022, pp. 653-656.
Xie et al., "Non-Abelian Monopoles in the Multiterminal Josephson Effect," Physical Review B, vol. 105, Jun. 2022, 7 pp.
Xie et al., "Topological Andreev Bands in Three-Terminal Josephson Junctions," Physical Review B, vol. 96, No. 16, Oct. 2017, 5 pp.
Xie et al., "Weyl Nodes in Andreev Spectra of Multiterminal Josephson Junctions: Chern Numbers, Conductances and Supercurrents," Physical Review B, vol. 97, No. 16, Jan. 31, 2018, 8 pp.
Yuan et al., "Supercurrent Diode Effect and Finite-Momentum Superconductors," Proceedings of the National Academy of Sciences, vol. 119, No. 15, Apr. 2022, 7 pp.
Zhang et al., "Nonreciprocal Superconducting NbSe2 Antenna," Nature Communications, vol. 11, No. 1, Nov. 2020, 9 pp.

* cited by examiner

SUPERCONDUCTING DIODES

CROSS-REFERENCE TO RELATED APPLICATIONS

This application claims the benefit of U.S. Provisional Application Ser. No. 63/366,424, filed Jun. 15, 2022, which is herein incorporated in entirety by reference.

GOVERNMENT RIGHTS

This invention was made with government support under DE-SC0019274 awarded by the U.S. Department of Energy, and DMR1554609 awarded by the National Science Foundation. The government has certain rights in the invention.

TECHNICAL FIELD

This disclosure relates to superconducting effect in devices in general, and to superconducting diodes.

BACKGROUND

Diodes are electrical devices in which the resistance of the diode is based on the direction of flow of current. A diode may have a relatively low resistance for current flowing in one direction, and a relatively high resistance for current flowing in the opposite direction. Superconducting devices are electrical devices that can have zero resistance for relatively small values of current.

SUMMARY

Devices, systems, and methods according to the present disclosure provide a superconducting diode effect. A Josephson junction may be defined between at least three terminals. A super-current may flow in a first direction between a terminal pair of the three terminals, while a dissipative current may flow in a second direction opposite the first direction between the terminal pair. For example, a dissipation-less supercurrent flows upon application of one current bias polarity, while applying an equivalent bias in the reverse direction produces a conventional dissipative current.

In some examples according to the present disclosure, a device includes a Josephson junction between at least three terminals. The device is configured to exhibit a superconducting diode effect.

In some examples according to the present disclosure, a device includes a substrate layer, an epitaxial aluminum layer, and a gate layer. The epitaxial aluminum layer includes three terminals defining a Josephson junction. The gate layer includes three gates. The epitaxial aluminum layer is between the gate layer and the substrate layer such that each gate of the three gates extends across a respective channel between a respective terminal pair of the three terminals. The device is configured to conduct a superconducting current in a first direction between two terminals of the three terminals. The device is configured to conduct a dissipative current in a second direction opposite the first direction between the two terminals.

In some examples according to the present disclosure, a system may include a device including a Josephson junction between at least three terminals. The system may further include a generator configured to generate an out-of-plane magnetic field. The out-of-plane magnetic field may be configured to tune a diode efficiency of the device.

In some examples according to the present disclosure, a method includes forming a Josephson layer including three terminals defining a Josephson junction. The method further includes forming, over the Josephson layer, a gate layer including at least three gates. Each gate of the at least three gates extends across a respective channel between a respective terminal pair of the three terminals. The Josephson layer and the gate layer are configured to exhibit a superconducting diode effect.

The details of one or more examples of the techniques of this disclosure are set forth in the accompanying drawings and the description below. Other features, objects, and advantages of the techniques will be apparent from the description and drawings, and from the claims.

DETAILED DESCRIPTION

Figure 1A:
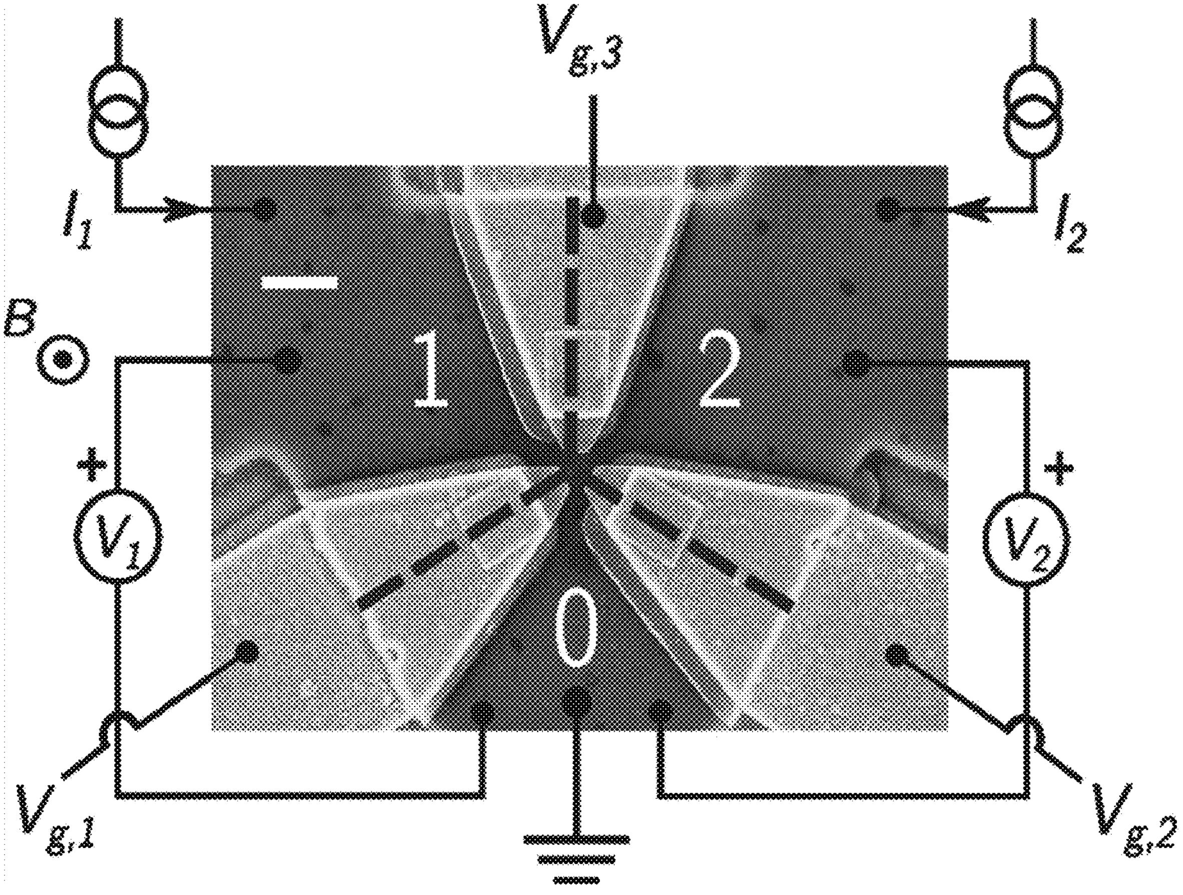
FIG. 1A is a diagram illustrating a false-color scanning electron microscope (SEM) image of a three-terminal Josephson junction device with individually tunable gates.

The phenomenon of non-reciprocal critical current in a Josephson device, termed Josephson diode effect, has been recently observed in a number of experiments. It is typically attributed to spin-orbit interaction and time reversal symmetry breaking.

The present disclosure describes examples of having the Josephson diode effect in a three-terminal Josephson device based upon an InAs quantum well with two-dimensional electron gas proximitized by epitaxial aluminum. In some examples, the diode efficiency can be tuned by a small out-of-plane magnetic field and electrostatic gating. The diode effect in this device may be a consequence of artificial realization of a current-phase relation containing higher harmonics.

In some examples according to the present disclosure, a device includes a Josephson junction between at least three terminals. The device is configured to exhibit a superconducting diode effect. Without being bound by theory, the Josephson diode effect in these devices is a consequence of an artificial realization of a current-phase relation that contains higher harmonics.

In some examples according to the present disclosure, a device includes a substrate layer, an epitaxial aluminum layer, and a gate layer. The epitaxial aluminum layer includes three terminals defining a Josephson junction. The gate layer includes three gates. The epitaxial aluminum layer is between the gate layer and the substrate layer such that each gate of the three gates extends across a respective channel between a respective terminal pair of the three terminals. The device is configured to conduct a superconducting current in a first direction between two terminals of the three terminals. The device is configured to conduct a dissipative current in a second direction opposite the first direction between the two terminals.

Thus, in some examples, a Josephson diode effect can occur in a relatively simple platform: a three-terminal Josephson device. The multi-terminal diode effect can be implemented on any materials platform that supports Josephson junctions. In some examples, the device is based on an InAs two-dimensional electron gas (2DEG) proximitized by an epitaxial aluminum layer. However, any semiconductor other than InAs could also be used, for example, to implement gate-tunability.

In some examples according to the present disclosure, a system may include a device including a Josephson junction between at least three terminals. The system may further include a generator configured to generate an out-of-plane magnetic field and tune a diode efficiency of the device. For example, such systems or devices may be used as gate-tunable building blocks of superconducting circuits to realize topologically protected qubits. Systems and devices according to the present disclosure may be switchable between positive polarity (the positive-bias critical current $$(I_c^+)$$

being larger than the negative-bias critical current $$(|I_c^-|)$$

and negative polarity $$(|I_c^-| > I_c^+)$$

by means of a small out-of-plane magnetic field or electrostatic gating.

In some examples according to the present disclosure, a method includes forming a Josephson layer including three terminals defining a Josephson junction. The method further includes forming, over the Josephson layer, a gate layer including at least three gates. Each gate of the at least three gates extends across a respective channel between a respective terminal pair of the three terminals. The Josephson layer and the gate layer are configured to exhibit a superconducting diode effect. For example, the method may be used to fabricate Josephson diode devices using any suitable material system exhibiting $2\pi$-periodic current-phase relation ($I \propto \sin\varphi$).

In some examples, the diode effect may be a property of multi-terminal Josephson devices, allowing for an immediately scalable approach by which potential applications of the Josephson diode effect can be realized, which is agnostic to the underlying material platform.

In some semiconducting diodes, the value of resistance depends upon the direction of the current flow. This asymmetry has been exploited in applications such as photodetectors, signal rectification, and oscillators. A superconducting diode would have dissipation-less supercurrent flowing upon application of one current bias polarity, while applying an equivalent bias in the reverse direction may produce conventional dissipative current. Josephson junctions (JJs) with non-reciprocal critical current (e.g., the magnitude of the critical current is dependent upon bias direction) are one avenue to realize a superconducting diode. Such non-reciprocal critical current behavior may be present in physical mechanisms including breaking of inversion and time reversal symmetries and exotic superconductivity. In some examples, interferometers based upon higher harmonic Josephson junctions can realize the Josephson diode effect, with implementation relying on highly transparent quantum point contact JJs.

The present disclosure describes example techniques to have the Josephson diode effect occur in a relatively simple device design: a three-terminal Josephson device, which may be based on a InAs two-dimensional electron gas (2DEG) with epitaxial aluminum. The present disclosure describes examples of simulations to show that this diode effect may be a consequence of synthetic realization of a Josephson current-phase relation containing higher harmonics in a device.

Thus, devices, systems, and methods according to the present disclosure may provide for a scalable, yet compact and robust, approach to realize potential technological applications of the Josephson diode effect.

Figure 1B:
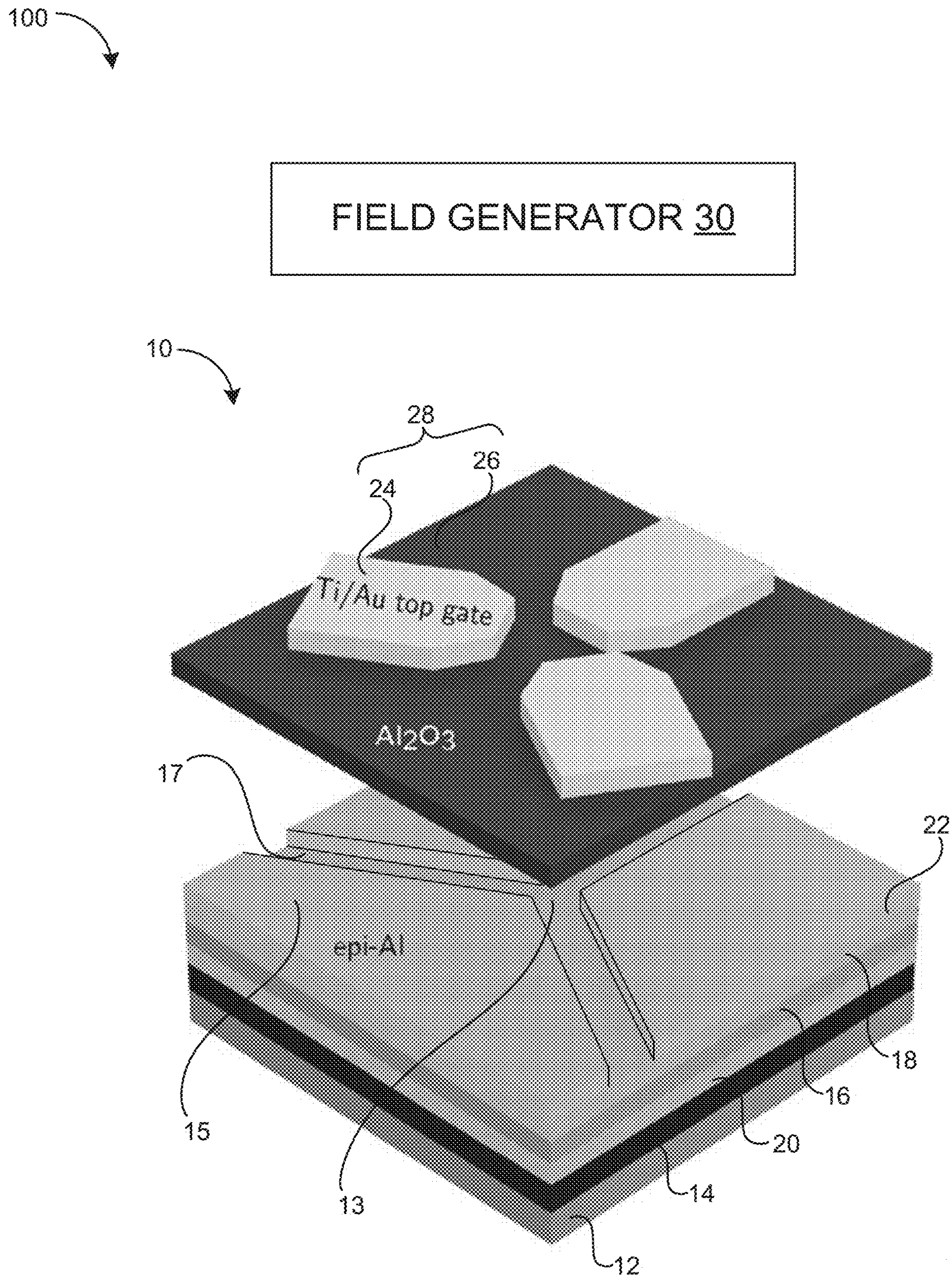
FIG. 1B is a schematic showing a layered heterostructure.

The following describes a three-terminal gated Josephson diode. A false-colored scanning electron micro-graph of an example device is shown in FIG. 1A. A heterostructure 10 used to fabricate example devices is shown in FIG. 1B. In some examples, heterostructure 10 is grown on a semi-insulating InP(001) substrate 12 by molecular beam epitaxy. From the bottom, heterostructure 10 includes a graded buffer 14 of $In_xAl_{1-x}As$ with x ranging from 0.52 to 0.81, 25 nm $In_{0.75}Ga_{0.25}As$ super-lattice. A 4.52 nm InAs quantum well 16 is protected by top and bottom 10.72 nm $In_{0.75}Ga_{0.25}As$ barriers 18 and 20. InAs quantum well 16 is proximitized by an epitaxial Al layer 22 of thickness 10 nm. Heterostructure 10 of FIG. 1A is nanofabricated by etching Al layer 22 in a Y-shape in the central area of the mesa, which forms a multi-terminal Josephson device, with three superconducting terminals (labeled 1, 2, and 0 in FIG. 1A). The spacing between the nodes is lithographically defined to be 50 nm. A gate layer 28 may include three independently tunable Ti/Au top gates 24 deposited on an $Al_2O_3$ dielectric layer 26. Each gate 24 may cover a respective leg of the Y-shaped region, leaving a small ungated region in the center.

Figure 1C:
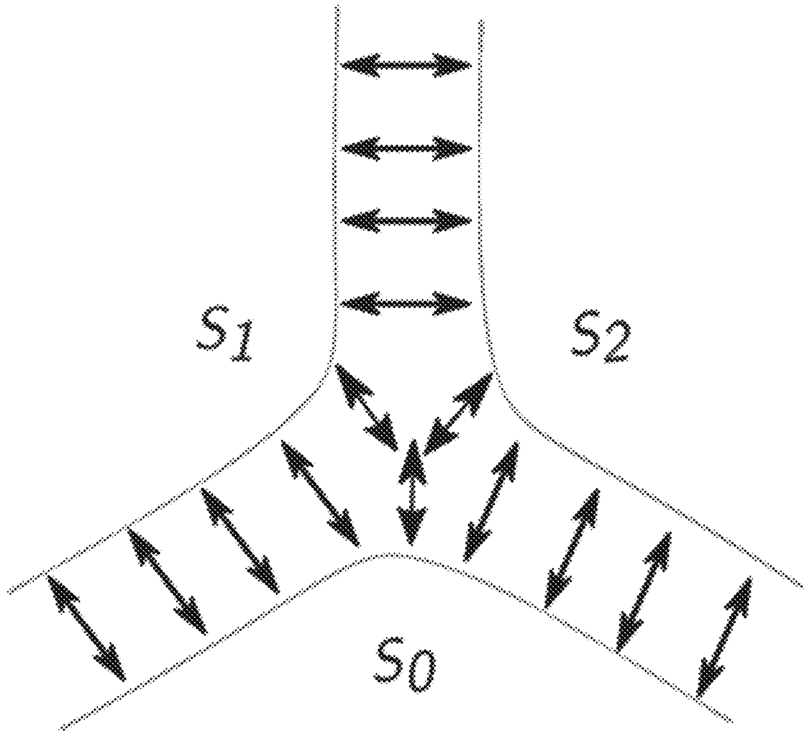
FIG. 1C is a schematic of transport in a three terminal Josephson device with a Y-shaped junction area.

Such a configuration may allow for independent control of the coupling between terminals. When there is no gate voltage applied, the majority of the transport between any two-pairs of terminals takes place via the legs of the Y-shaped junction as illustrated in FIG. 1C.

Figure 2A:
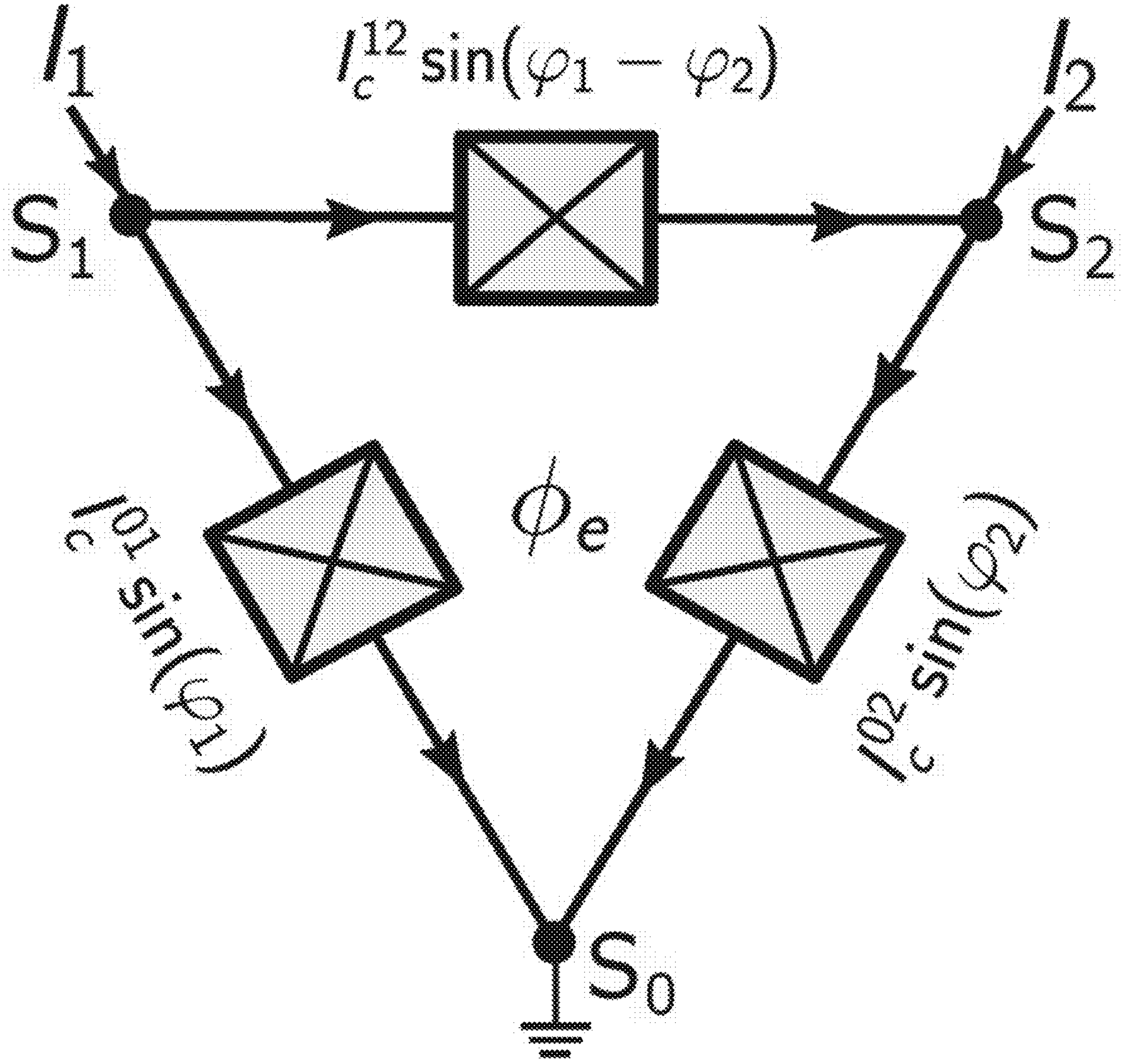
FIG. 2A is a conceptual diagram of an effective transport model based on upon three junctions connected on sides of a triangle.

Without being bound by theory, three-terminal Josephson devices may be effectively modeled as a circuit with three Josephson junctions connected in a triangular configuration as shown in FIG. 2A. For source terminal 1 and drain terminal 0 the current conservation equations lead to EQUATIONS 1 and 2:

$$I_1 = I_c^{01}\sin(\phi_1) + I_c^{12}\sin(\phi_1 - \phi_2 - \phi_e) \quad \text{(Equation 1)}$$

$$I_0 = I_c^{02}\sin(\phi 2) + I_c^{12}\sin(\phi_2 - \phi_1 + \phi_e) \quad \text{(Equation 2)}$$

In the above example, $Ic^{ij}$ is the critical current between terminal i and j, and $\phi_1$ and $\phi_2$ are the phase differences between terminal 1 and 0 and terminal 2 and 0 respectively. In the above equations, $\phi_e$ is the external flux threaded by the applied magnetic field normalized by the flux quantum $\phi_0$. If the critical currents in all three arms are equal, $$I_c^{01} = I_c^{02} = I_c^{12} = I_c,$$

leading to $I_1$ per EQUATION 3:

$$I_1 = I_c(\sin \phi_1) + \sin((\phi_1 \pm \phi_e + 2n\pi)/2) \quad \text{(Equation 3).}$$

Figure 2B:
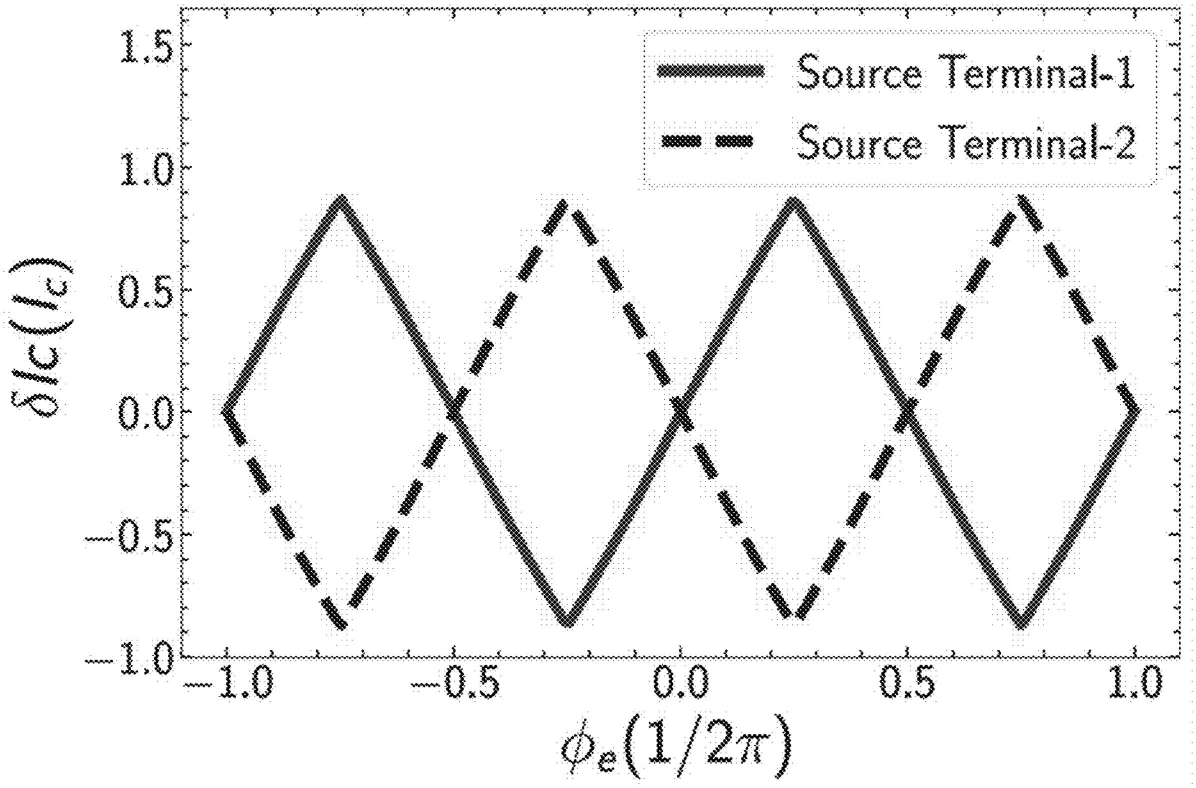
FIG. 2B is a graph illustrating current between terminals 1 and 0, shown in solid line, and between terminals 2 and 0 shown in dashed line.

The difference between the switching currents in the positive direction $$(I_c^+)$$

and negative direction $$(I_c^-),\ \delta Ic = I_c^+ - |I_c^-|,$$

is given by the difference between the maximum and minimum values of Eq. 3. This is plotted in FIG. 2B in dashed line showing positive polarity of the diode. If instead terminal 2 is the source and terminal 0 the drain, this calculation gives the opposite polarity of δIc. These results can be extended to devices with more than three terminals, establishing multi-terminal Josephson devices as a generic platform to realize a Josephson diode effect. Without being bound by theory, the origin of the diode effect in this system may be related to the breaking of inversion symmetry by the device configuration. The choice of source and drain terminals confers a chirality to the circuit, which breaks inversion symmetry, giving gives rise to the Josephson diode effect in multi-terminal Josephson devices. In some cases, this result is independent of the materials platform used to realize the junctions.

The following describes non-reciprocal supercurrent flow. Current-biased DC measurements were performed using a three-terminal configuration shown in FIG. 1A in a dilution refrigerator at a base temperature of 14 mK. Terminals 1 and 0 are biased by a DC current source, labeled $I_1$, and the voltage across the same terminals, $V_1$ is measured simultaneously, while terminal 2 is electrically floating. An external out-of-plane magnetic field, B, is applied using a superconducting magnet. To measure the critical current, the differential resistance $R=dI_1/dV_1$ is calculated as a function of bias current and the applied field. The critical current is measured in both bias directions, starting at zero current bias to exclude the effects of Joule heating.

Figure 3A:
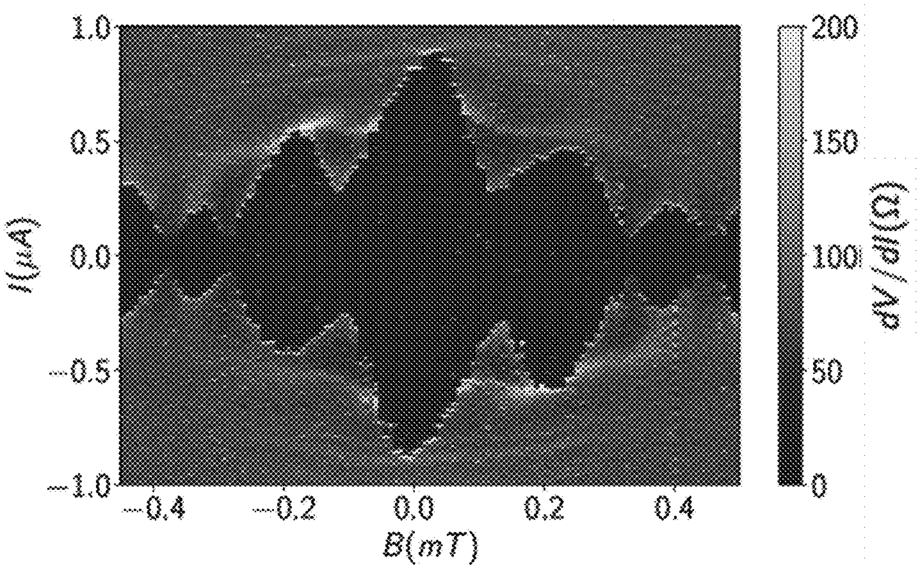
FIG. 3A is a color map of device resistance as a function of bias current and applied out-of-plane magnetic field, B.
Figure 3B:
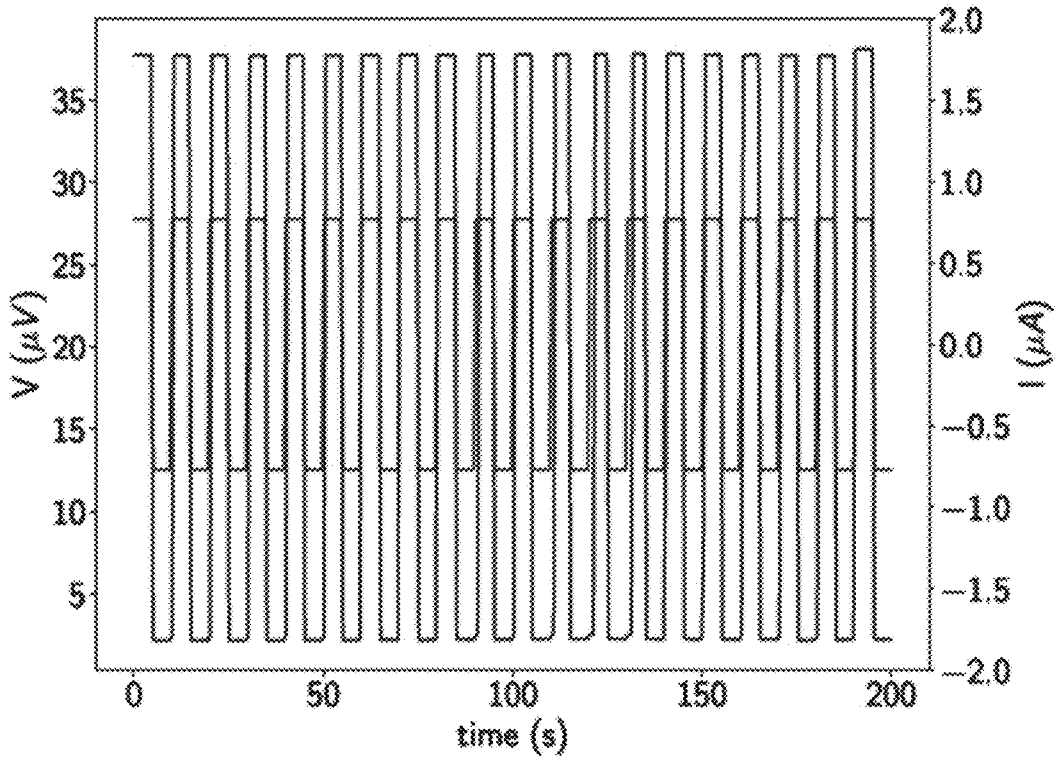
FIG. 3B is a graph illustrating measured voltage drop, shown having the larger amplitude between 0 and 40 microvolts, for an applied square wave current pulse, shown having the smaller amplitude between −1.0 and 1 microamps, at B=−0.06 mT.

The results at zero gate voltage, $V_{g.1}=V_{g.2}=V_{g.3}=0$ V are described. FIG. 3A shows the differential resistance map as a function of $I_1$ and B. The asymmetry between positive and negative bias is visible as the Fraunhofer-like quantum interference lobes are tilted with respect to the current axis. From this resistance map, ΔIc is extracted and a diode efficiency Q can be calculated with $$Q = \delta Ic / (I_c^+ - |I_c^-|).$$

Figure 3C:
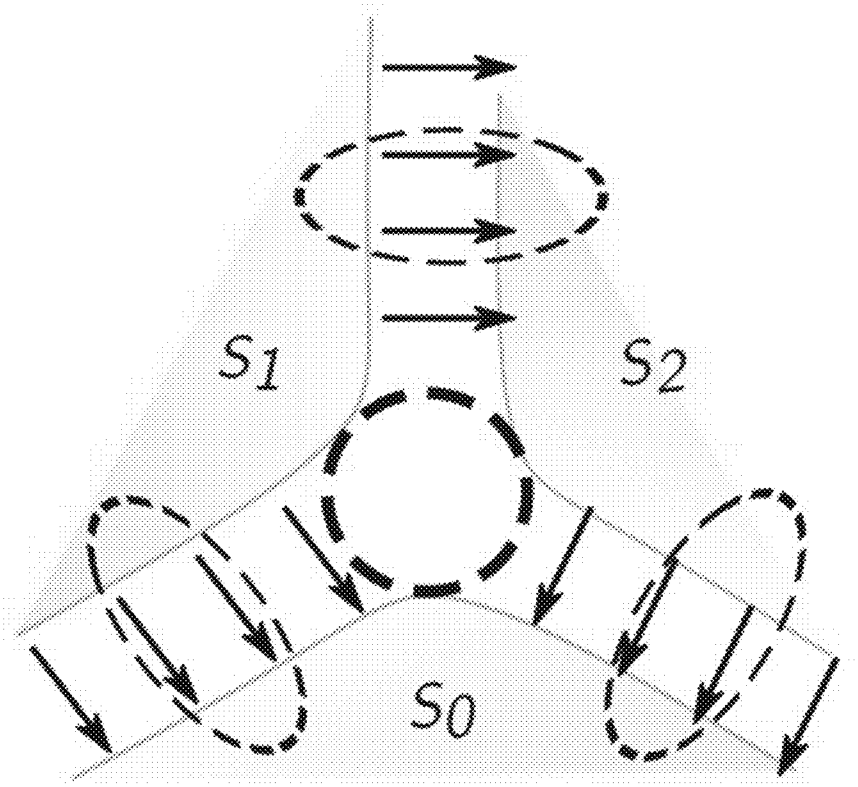
FIG. 3C is a conceptual diagram illustrating a schematic of the model derivation.
Figure 3D:
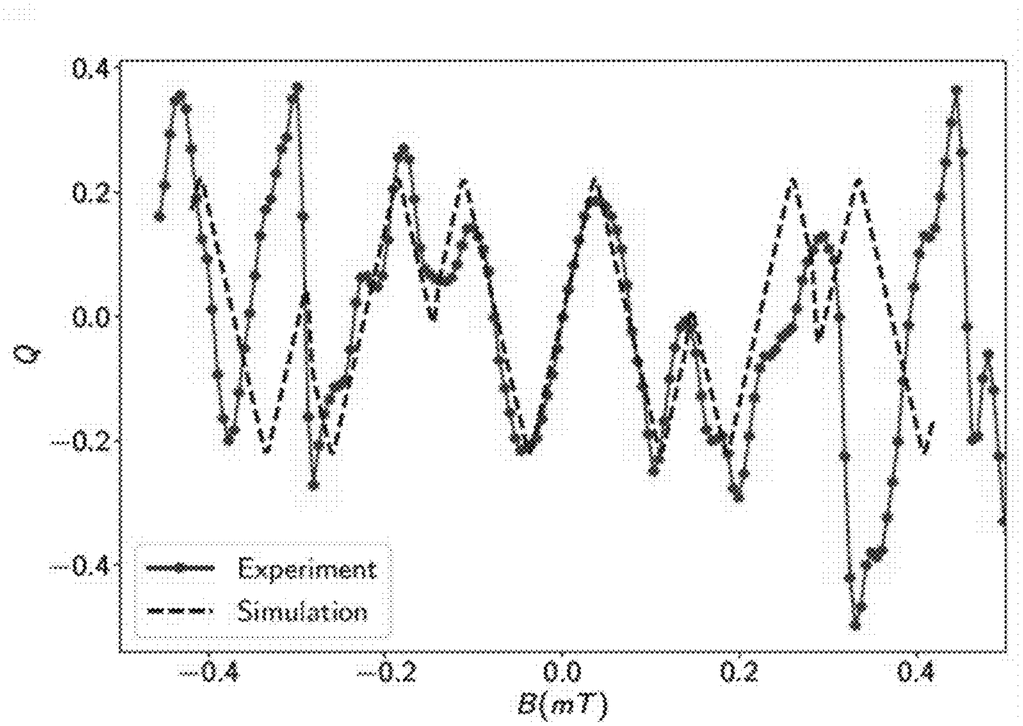
FIG. 3D is a graph illustrating diode efficiency factor Q as a function of B obtained from simulations, shown in dashed line, and experiment, shown in dotted line.

The experimental diode efficiency as a function B is shown by the dotted line curve in FIG. 3D. Q shows periodic oscillations in B, displaying that the diode efficiency is tunable by a small B. These oscillations roughly follow a Φ0/2 periodicity. By setting B=−0.06 mT, the diode is tuned to have a negative polarity. At this B, the supercurrent rectification of a square wave may be represented with an amplitude of A=0.72 μA, such that $$I_c^+ < A < |I_c^-|,$$

and a frequency of 0.2 Hz. The may device remain superconducting for the negative cycle of the square wave and has a finite voltage drop for the positive cycle.

The device may show no decrease in rectification performance after 104 cycles. The presence of diode efficiency and supercurrent signal rectification demonstrate that this device design can indeed act as a superconducting analogue to a semiconducting diode. Some punch-through errors in rectification may be present, but are believed to be due to either thermal fluctuations or universal critical current fluctuations.

In the examples above, the device was modeled as a network of three Josephson junctions with a flux through the enclosed area, but with no flux penetrating the junctions themselves. As such, this model may not reproduce the observed Fraunhofer-like interference pattern. In some examples, the point-like Josephson junctions may be extended to planar ones to take into account local variation in the critical current density ($J_c(x)$).

Using the four integration paths as shown in FIG. 3C and current conservation equations, the critical current can be calculated numerically for a given B and $J_c(x)$. To model the zero gate voltage case, a uniform current distribution may be used where $J_c(x)$=constant. The diode efficiency factor obtained from this updated model as a function of B shows good agreement with experimental results shown in FIG. 3D. For higher values of B the model starts to deviate from our experimental results, possibly due to flux focusing effects in the junction area. In some examples, the polarity of this diode can be flipped by changing the source-drain configuration to terminals 2 and 0, as described above.

Figure 4A:
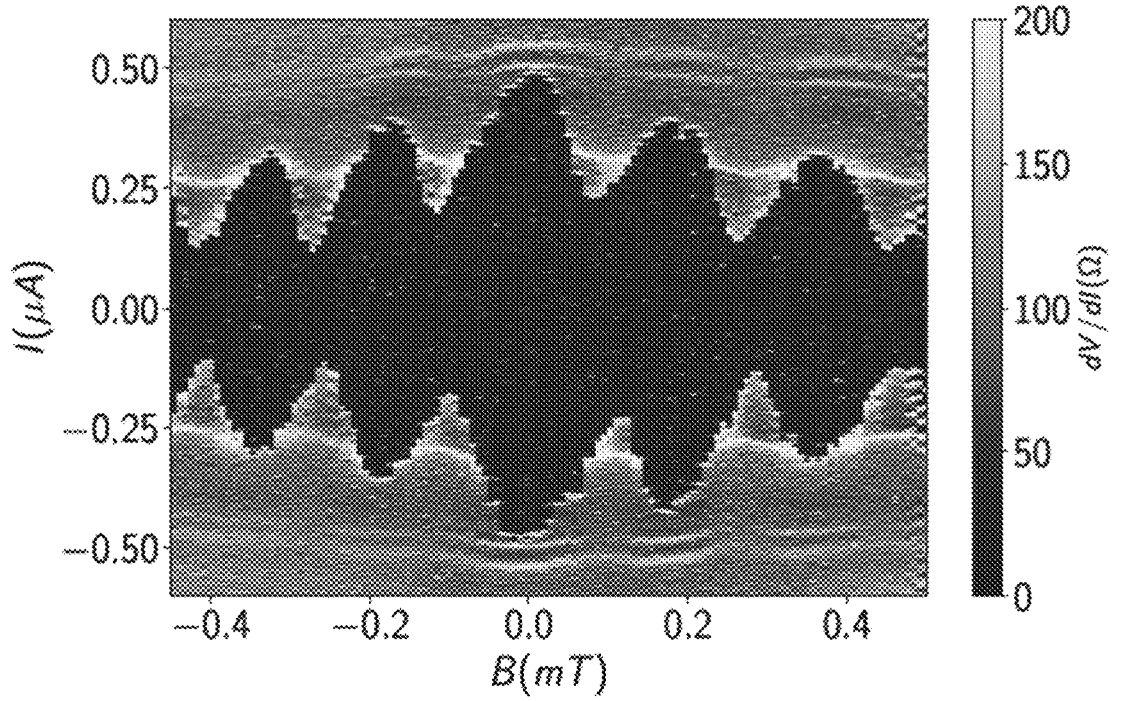
FIG. 4A is a color map of device resistance as function of bias current and B, with all three split gates set to a value of −1.5V.

The following describes gate tunability. Applying negative voltage on the gates changes the supercurrent density profile in the Y-shaped region. In terms of the network model, local variations in $J_c(x)$ caused by gating may lead to fundamentally different results. At gate voltage of $V_g$=−1.5 V the critical current density profile in each leg of the junction becomes closer to that of a planar asymmetric superconducting quantum interference devices (SQUID) with two peaks in $J_c(x)$. One of the peaks forms near the common central region as the gates do not cover the legs of the Y-shaped junction entirely. The other peak forms near the mesa edge as supercurrent at the edge couples more weakly to the electrostatic gating compared to the middle of the legs of the Y-shaped junction. This may be due to formation of an electron accumulation layer at the mesa edge, which is a consequence of the band bending effect of InAs. As a result, a more negative gate voltage is needed to suppress the critical current density near the edge compared to bulk. This may result in a marked change in the interference pattern from Fraunhofer-like, as seen in FIG. 3A, to SQUID-like, as seen in FIG. 4A. Sweeping the gate voltage further to $V_g$=−2.5 V may suppress the peak in $J_c(x)$ near the central region but has a smaller effect on the critical current density near the mesa edge, resulting in an interference pattern shown in FIG. 4B.

Figure 4B:
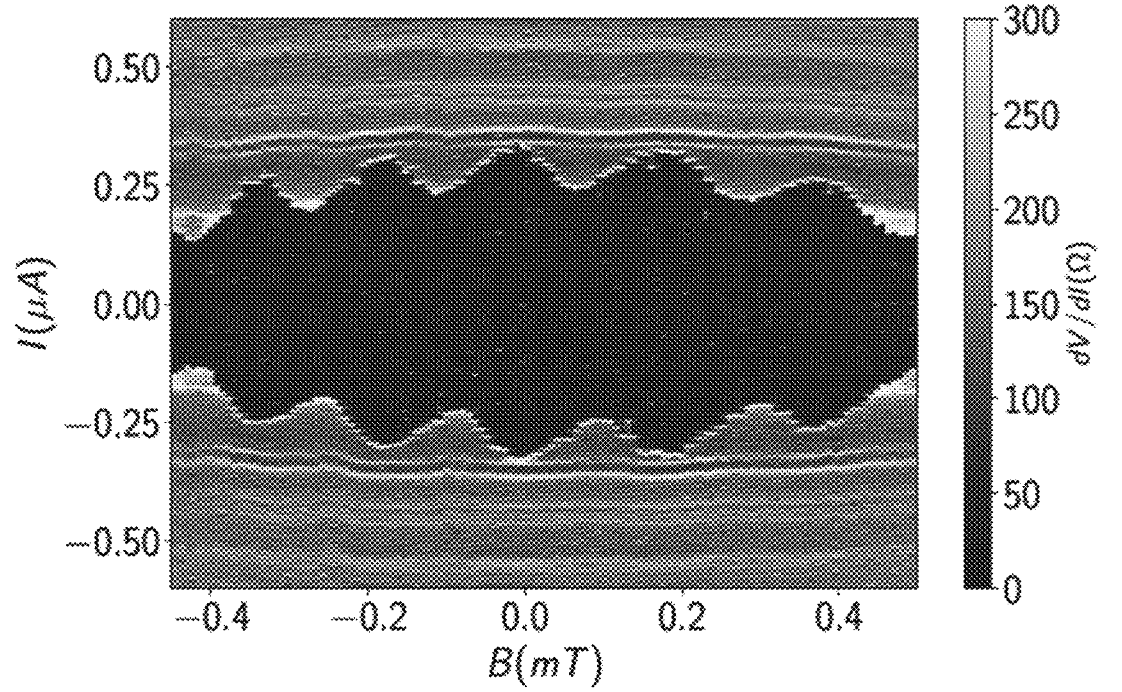
FIG. 4B is a color map of device resistance as function of bias current and B, with all three split gates set to a value of −2.5V.
Figure 4C:
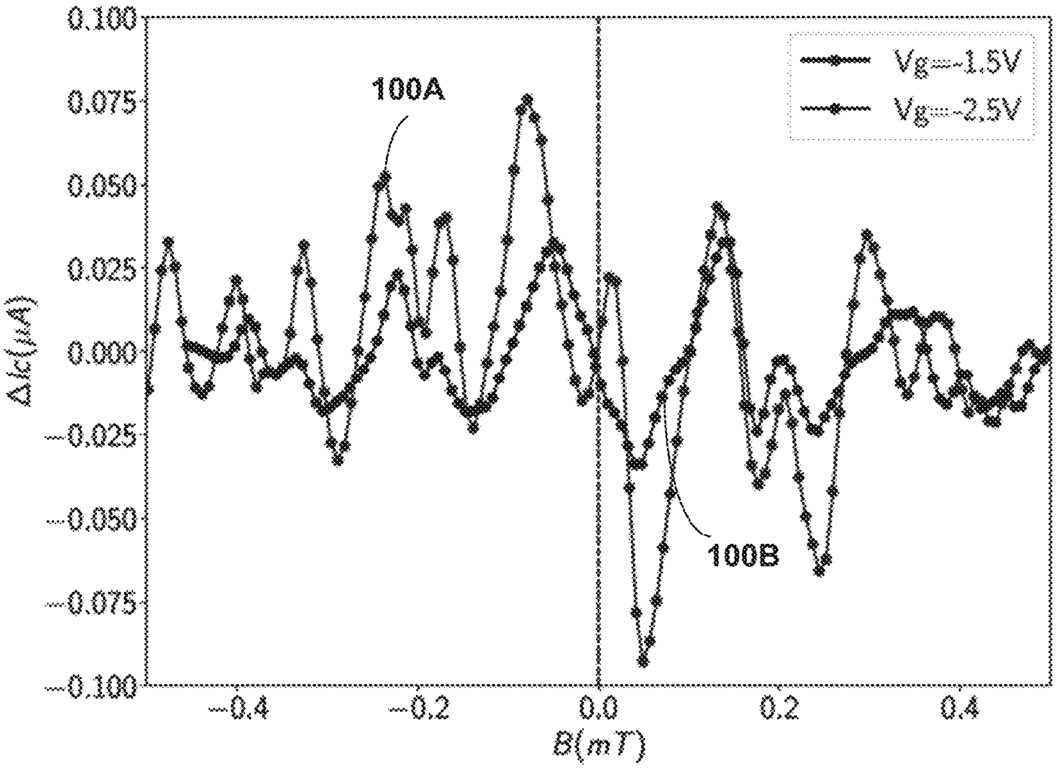
FIG. 4C is a graph of current for the color maps of FIGS. 4A and 4B.
Figure 4D:
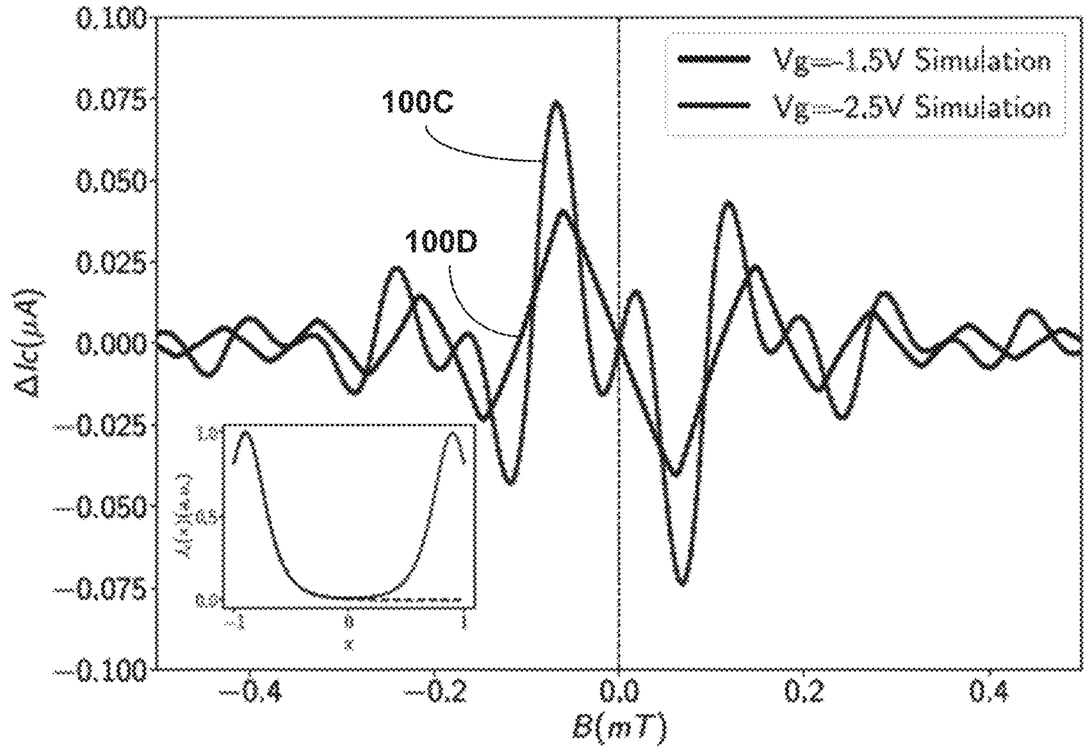
FIG. 4D is a graph of simulated current for the two different gate voltages of FIGS. 4A and 4B with inset showing critical current density profile used to stimulate.
Figure 5A:
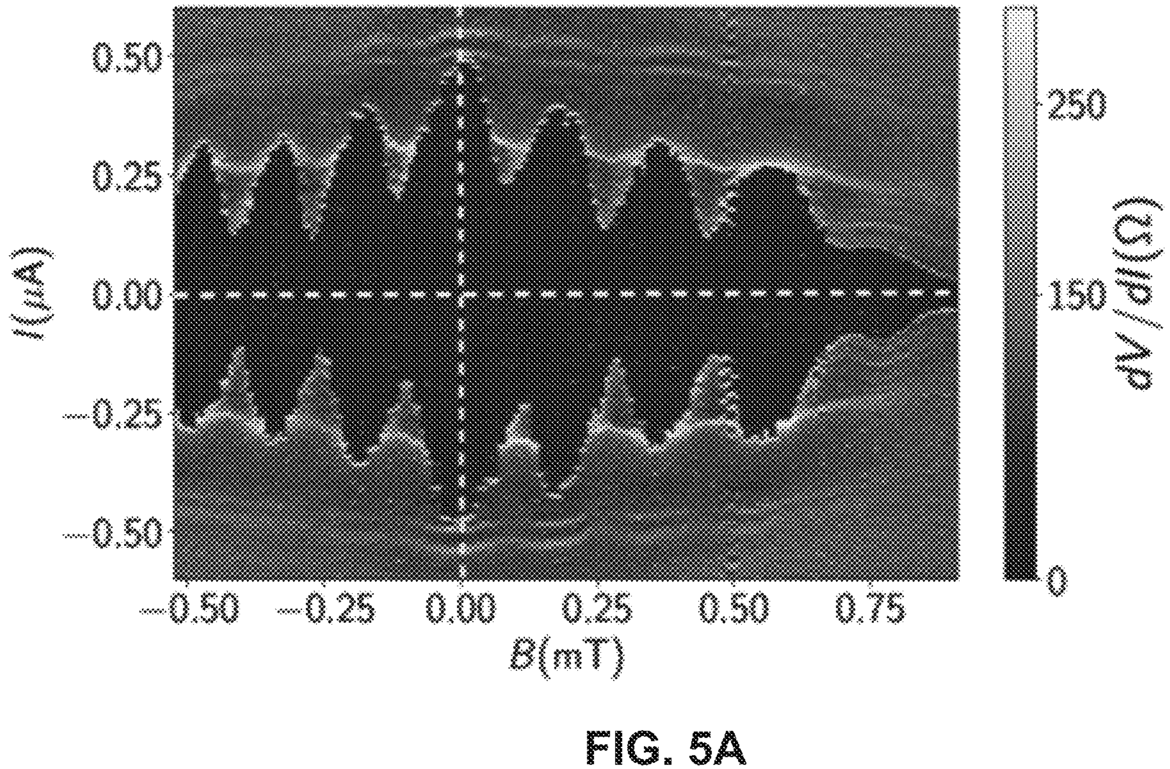
FIG. 5A is a color map of device resistance as function of bias current and B, with all three split gates set to a value of −1.5V.
Figure 5B:
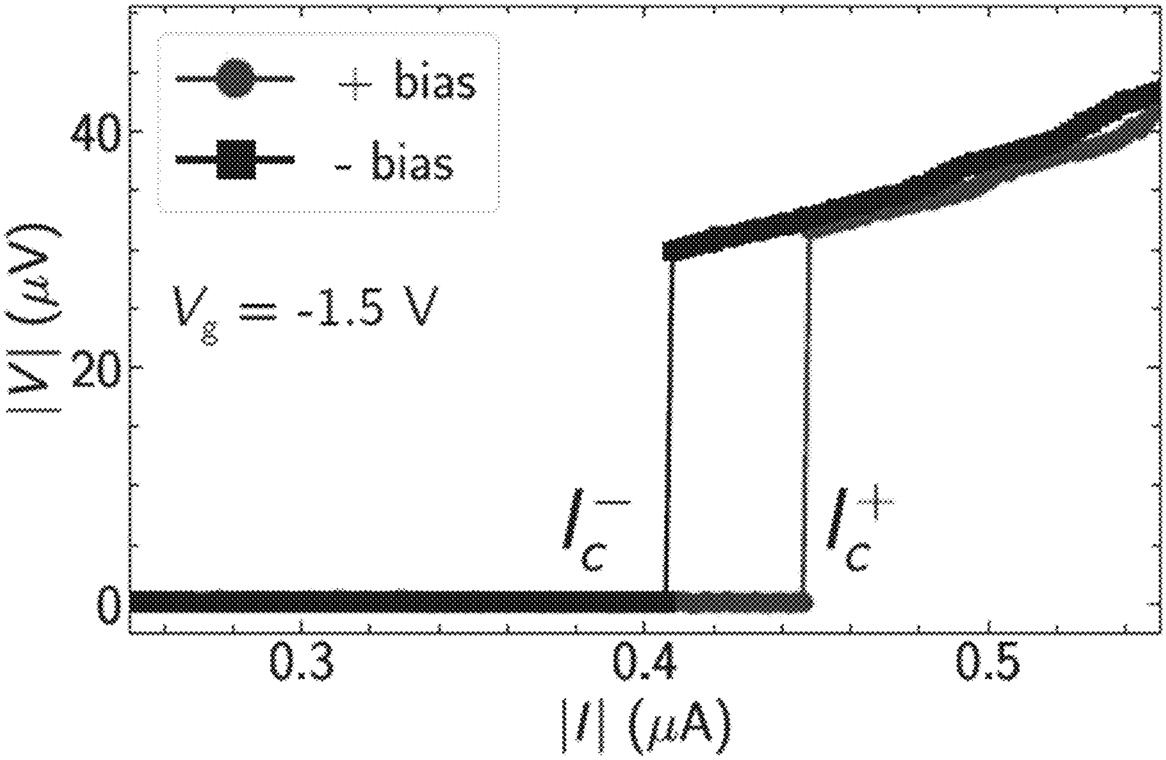
FIG. 5B is a is a graph illustrating current-voltage characteristics for the device of FIG. 5A with both bias directions, with biasing field B=0.04 mT.
Figure 5C:
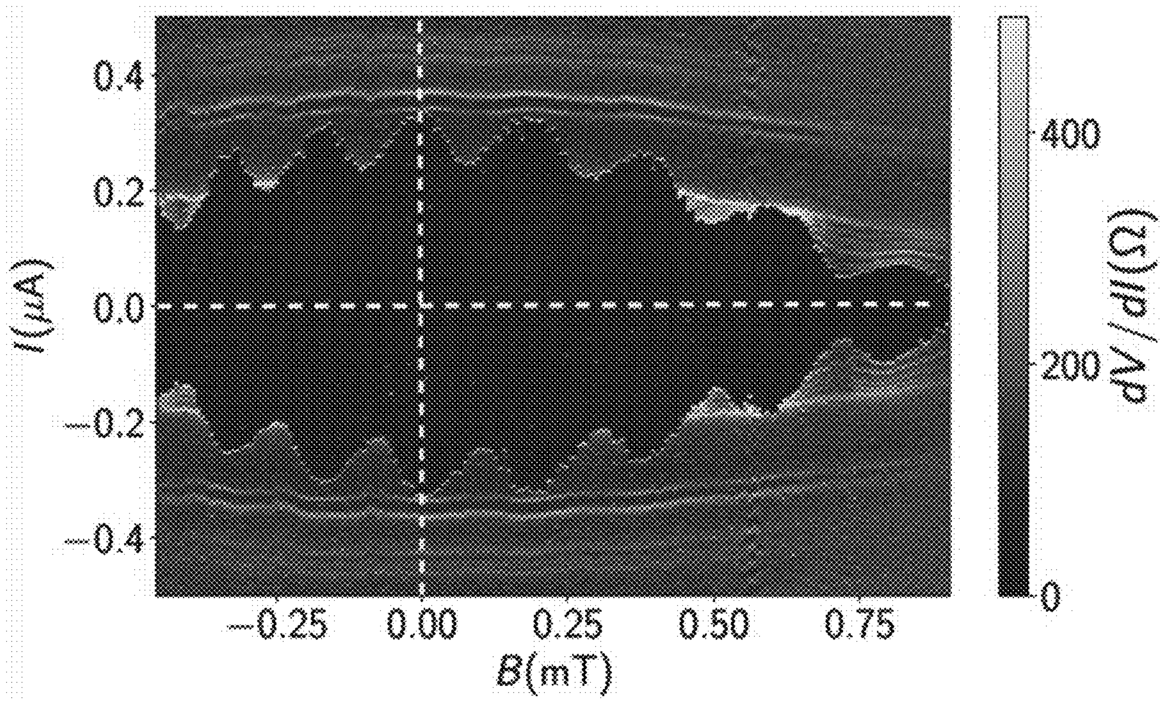
FIG. 5C is a color map of device resistance as function of bias current and B, with all three split gates set to a value of −2.5V.
Figure 5D:
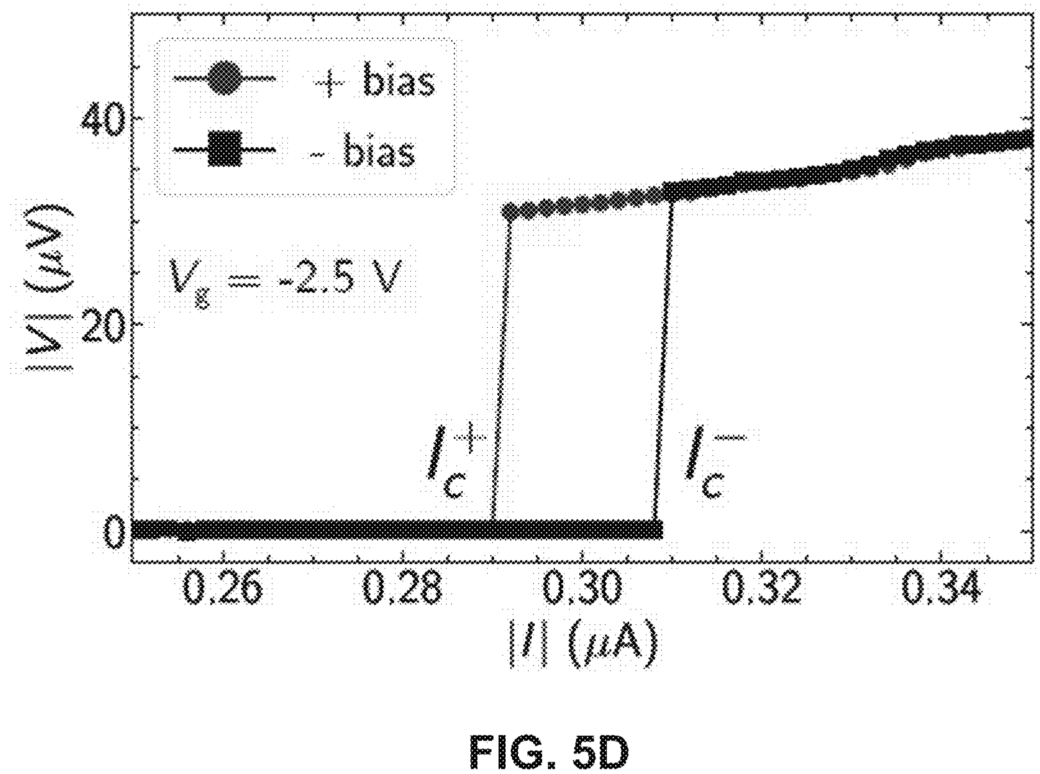
FIG. 5D is a is a graph illustrating current-voltage characteristics for the device of FIG. 5C with both bias directions, with biasing field B=0.04 mT.
Figure 5E:
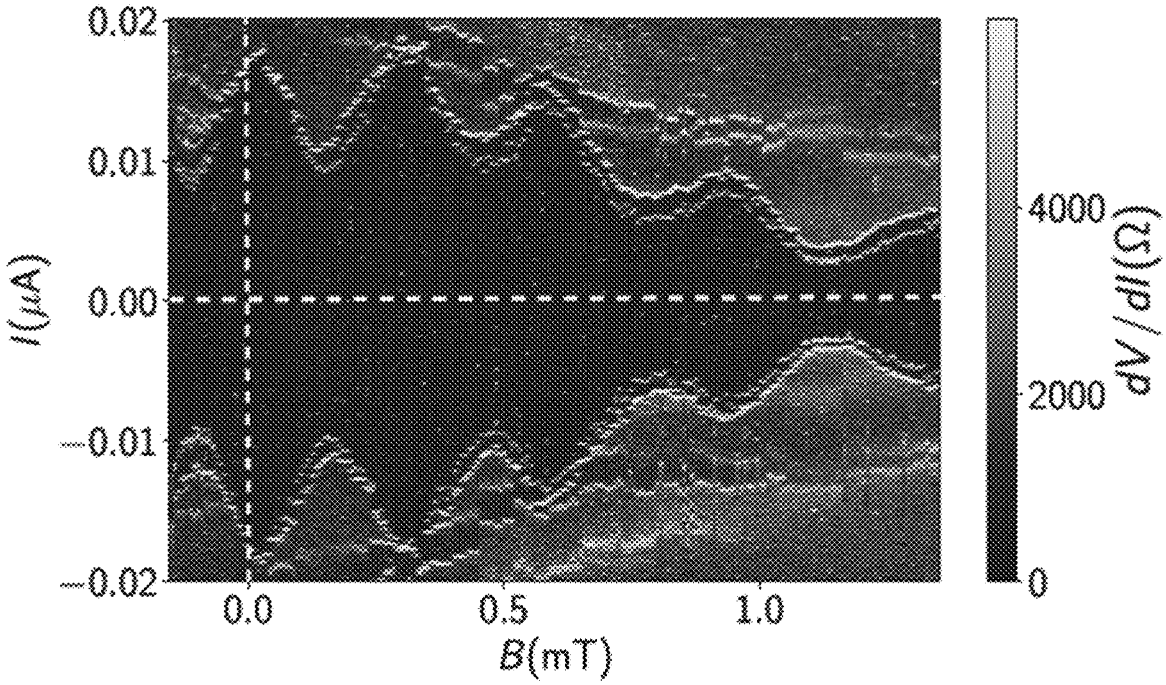
FIG. 5E is a color map of device resistance as function of bias current and B, with all three split gates set to a value of −4.1V.
Figure 5F:
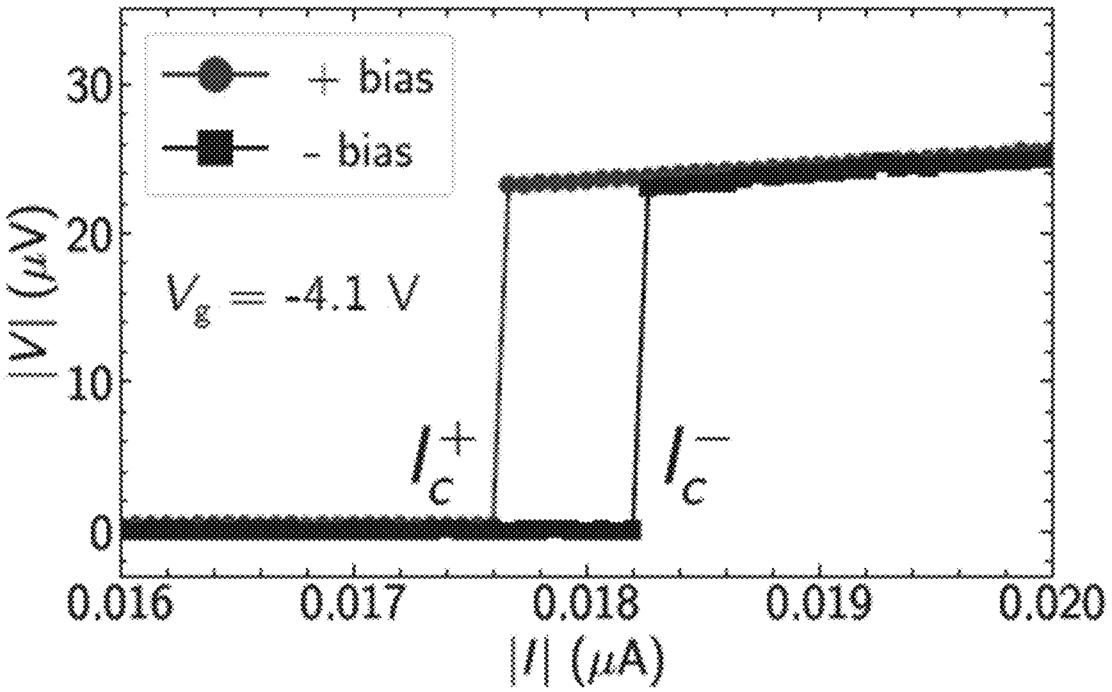
FIG. 5F is a is a graph illustrating current-voltage characteristics for the device of FIG. 5E with both bias directions, with biasing field B=0.04 mT.

Simulated values of $\Delta I_c$ using these critical density profiles (inset of FIG. 4D) in all three legs of the junction show good agreement with experimental values of $\Delta I_c$ extracted from the colormaps in FIGS. 4A and 4B (see FIG. 4C). In FIG. 4C, line 100A is for measured current with gate voltage at −1.5V, and line 100B is for measured current with gate voltage at −2.5V. In FIG. 4D, line 100C is for the simulated current with gate voltage at −1.5V, and line 100D is for the simulated current with gate voltage at −2.5V. $\Delta I_c$ obtained under gating shows marked difference from the case of zero gate voltage. Overall, the magnitude of $\Delta I_c$ decreases as a function of gate voltage, but gating also alters the B-periodicity of the polarity of the diode.

Figure 3E:
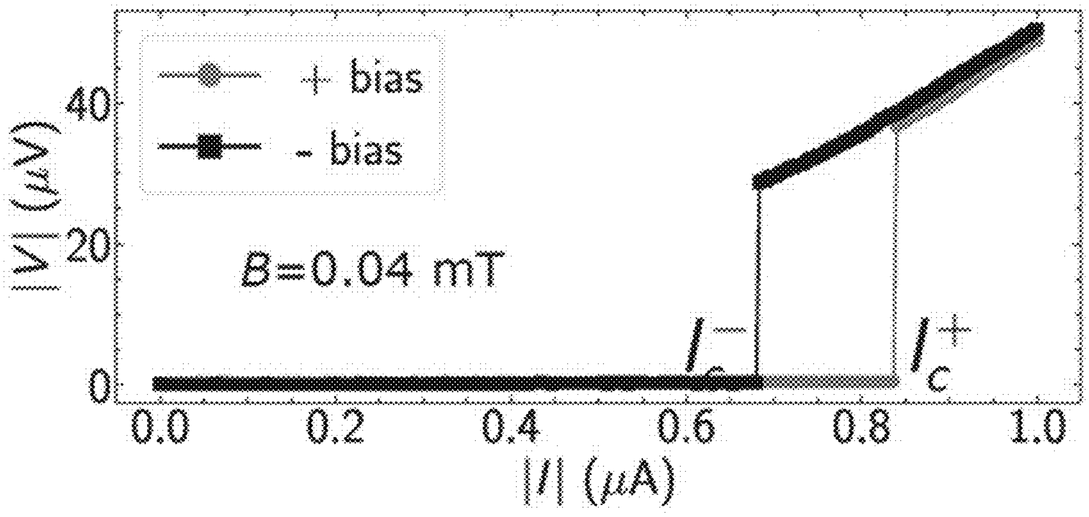
FIG. 3E is a graph illustrating current-voltage characteristics for both bias directions, with biasing field B=0.04 mT.
Figure 3F:
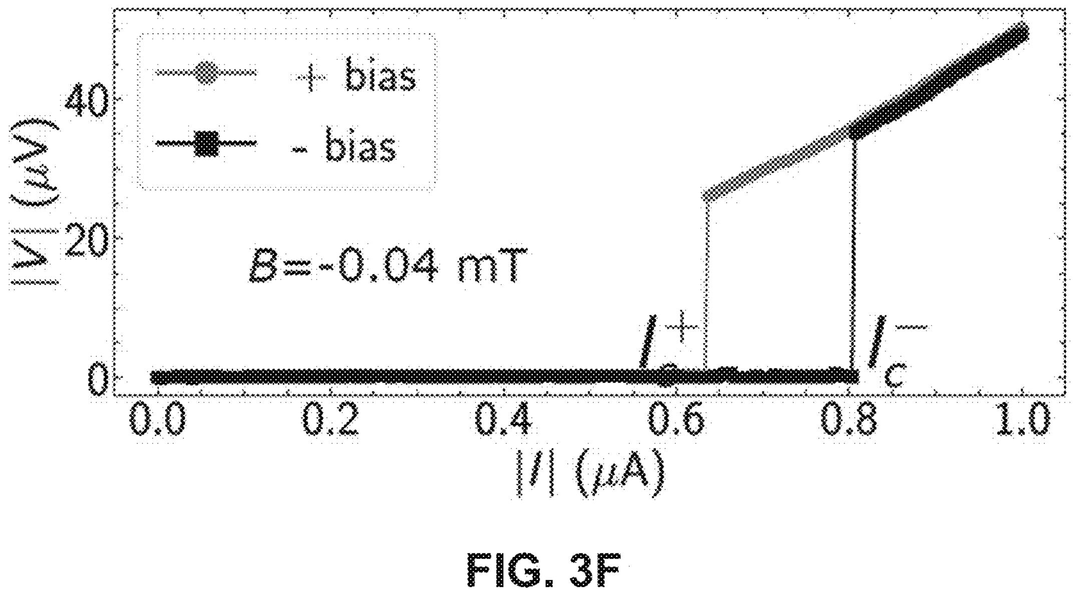
FIG. 3F is a graph illustrating current-voltage characteristics for both bias directions, with biasing field B=−0.04 mT.

Further gating effects are described with reference to FIGS. 5A to 5F, which represent effects of applying different symmetric negative gate voltage $V_g$ to all three gates. Comparing the data obtained at $V_g$=0 (FIG. 3A) to that taken at $V_g$=−1.5 V (FIG. 5A), the Fraunhofer-like modulation of the lobes away from B=0 is suppressed, with the lobe amplitudes becoming more uniform. Further gating to $V_g$=−2.5 V and $V_g$=−4.1 V (FIGS. 4C and 4D) continues this trend, with the interference pattern acquiring a close resemblance to that seen in a planar SQUID. These changes in the interference pattern also affect diode efficiency. At B=0.04 mT, the diode has a positive polarity for $V_g$=0 V and −1.5 V, but a negative polarity for $V_g$=−2.5 V and −4.1 V. In other words, in FIGS. 3E ($V_g$=0 V) and FIG. 5B ($V_g$=−1.5 V), the critical current in the positive bias direction, $$I_c^+,$$

is higher than the critical current in negative bias direction, $$I_c^-,$$

however this polarity is reversed upon further application of gate voltage (FIGS. 5D and 5F) where $$I_c^- > I_c^+.$$

This polarity flip upon gating is equivalent to changing the chirality of the device.

Thus, for the same applied magnetic field value the diode can have a different polarity, depending on the value of $V_g$. This may be equivalent to changing the chirality of the device. At sufficiently negative values of the gate voltages $V_{g,2}$ and $V_{g,1}$, the device can be brought into effectively a two-terminal regime, and there may not be any non-reciprocal transport in this regime. The present disclosure provides gate tunability of a Josephson diode's efficiency and polarity.

In one or more examples, the results from one or more of the example techniques establish a scalable approach to realize the Josephson diode effect and achieve a gate-tunable non-2π-periodic Josephson device. The core diode effect may not require gating, and may depend only on the three-terminal nature of the device and could thus be realized on other materials platforms, including with Al—AlOx Josephson junctions. The RF measurements on one or more of the example devices show the expected asymmetry on the current axis, further confirming the 2ϕ contribution in the Josephson energy. All of the measurements were performed by either setting $I_2$ or $I_1$ to be zero. The simulations show that a finite value of I2 can enable non-reciprocal transport even at zero field. This may allow this device to function as Josephson phase battery while also providing a field-free avenue to realize the Josephson diode effect. The external magnetic field may also be eliminated by the use of nanomagnets which may provide enough flux to induce non-reciprocal transport. In some examples, the device realizes the gate tunable Josephson energy profile necessary to make recently-predicted Weyl Josephson circuits. Thus, with the addition of capacitive coupling, which is possible on this material system, devices according to the present disclosure may be amenable to realizing topologically-protected Weyl states at the circuit level.

The following describes example device fabrication. Standard electron beam lithography (EBL) and wet etching techniques were used to fabricate a mesa and the Y-shaped junction area. Approximately 40 nm of Al2O3 dielectric was deposited using thermal atomic layer deposition (ALD). Using EBL, split gates are defined over the junction area and electrodes are deposited using electron-beam evaporation of Ti/Au (5 nm/50 nm). In a separate lithography step, thicker gold contacts (Ti/Au, 5 nm/200 nm) are made to the gate electrodes.

The following describes measurement details. Differential resistance maps on both devices and conductance quantization data on device were obtained by low-noise DC transport measurements in a 3He/4He dilution refrigerator. Low-pass Gaussian filtering was used to smooth numerical derivatives. Joule-heating may be excluded by starting the bias sweeps at zero current for both positive and negative sweep directions. A magnetic field offset $B_{offset}$ is subtracted from all the magnetic field sweeps. $B_{offset}$ is set by the field value where $$I_c^+ = |I_c^-|.$$

Figure 6A:
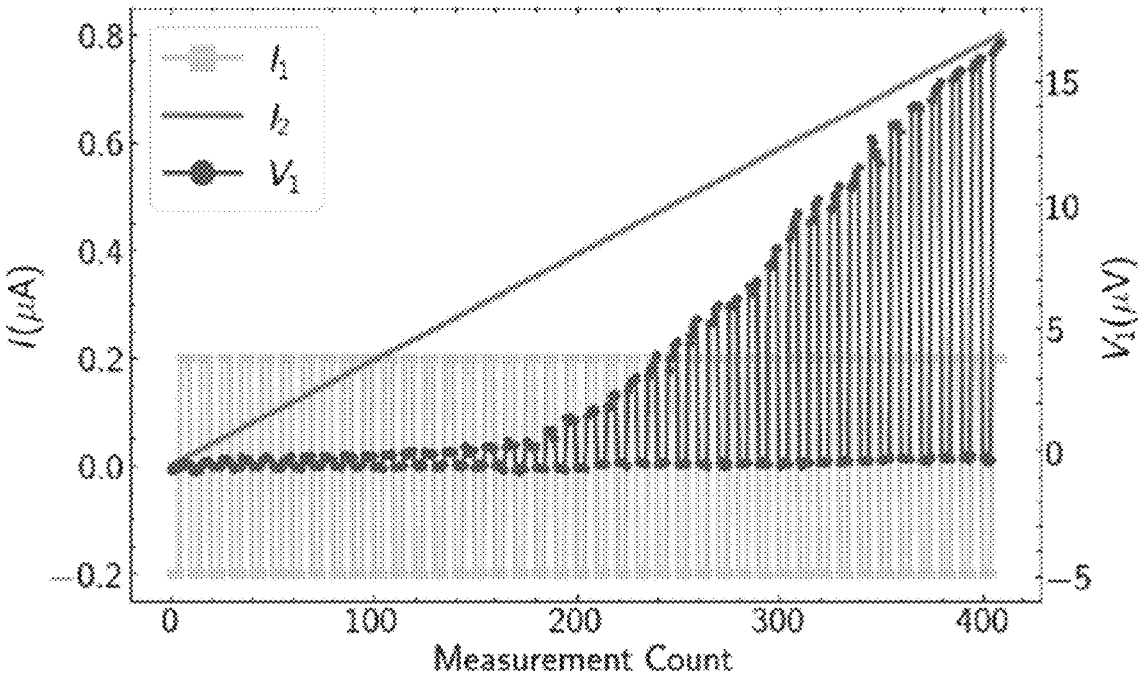
FIG. 6A is graph illustrating nonlinear intermodulation of applied signals $I_1$ and $I_2$ on measured voltage $V_1$.

As described elsewhere in the disclosure, one terminal of a three-terminal device may be retained electrically floating. In some examples, all three terminals may be biased and read out. For example, a square wave current signal of amplitude A=0.2 μA may be applied on terminal 1 ($I_1$) and a linearly increasing current signal on terminal 2 ($I_2$). For small values of $I_2$, $V_1 \approx 0$, but as $I_2$ is increased beyond approximately 0.3 μA, rectified pulses of finite $V_1$ may be observed. The magnitude of $V_1$ increases nonlinearly as a function of $I_2$, as shown in FIG. 6A. Such non-linear intermodulation of signals resembles, for example, the activation of a neuron. In some examples, devices according to the present disclosure may be configured for use in neuromorphic computing, or artificial intelligence applications in general.

A simplified network model for the device similar to that shown in FIG. 2A may be used to analyze the three-terminal read out. For small values of $I_2$, the junction between terminals 2 and 0 remains superconducting, hence $I_2$ is shunted to the ground by this Josephson junction. Since the magnitude of the square wave input to terminal 1 is less than $|Ic^{01}|$, the device output, $V_1$, is essentially zero. As $I_2$ increases above $Ic^{02}$, the net current across the junction between terminal 1 and 0 exceeds $Ic^{01}$ for the positive cycling of $I_1$, resulting in $V_1>0$. For negative $I_1$, the net current remains below $Ic^{01}$ and $V_1 \approx 0$.

Figure 6B:
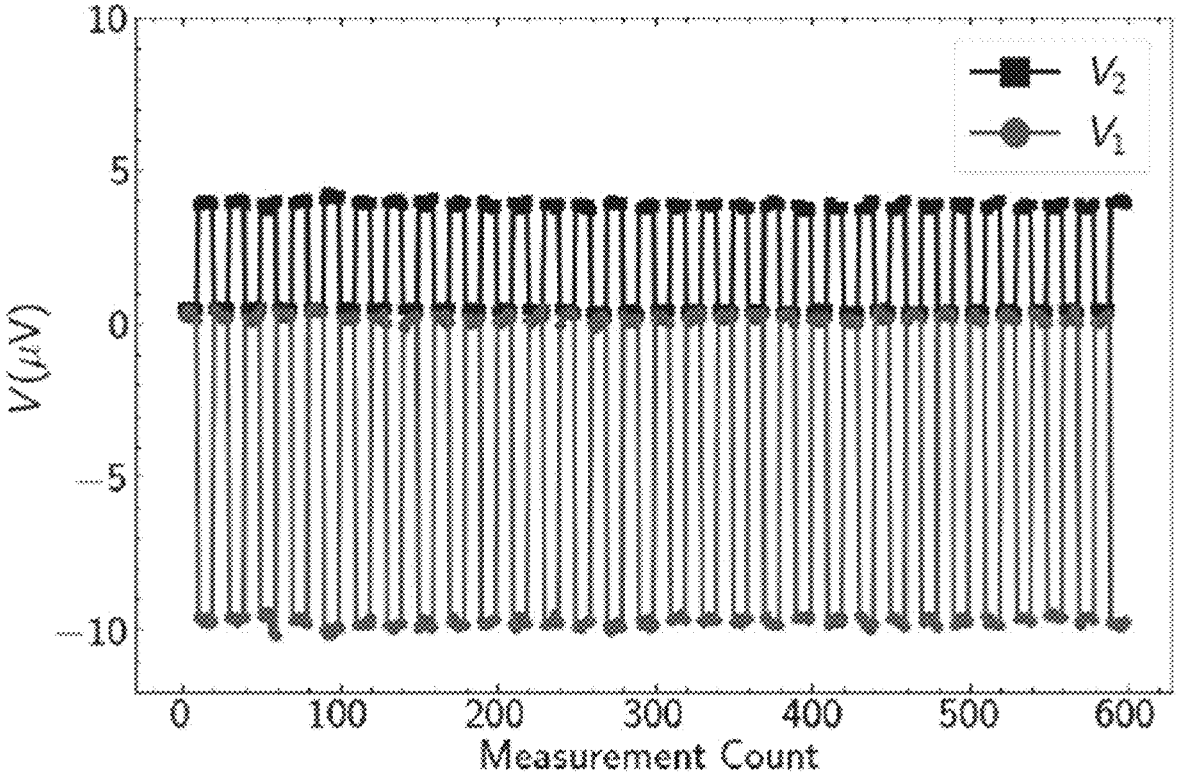
FIG. 6B is graph illustrating simultaneous rectification of two applied out-of-phase square wave signals on terminals 1 and 2.

The polarity of the diode depends upon the selection of source and drain terminals, which relates to the effective CφR. For example, simultaneous rectification of two signals with opposite polarities may be achieved. Two square wave signals of the same amplitude (A=0.6 μA) were simultaneously applied on terminals 1 and 2, such that they are out of phase with each other. Under these conditions, two simultaneously rectified signals were observed, one on terminal 1 ($V_1$) and one on terminal 2 ($V_2$), with opposite polarities and different magnitudes, as shown in FIG. 6B.

Figure 7A:
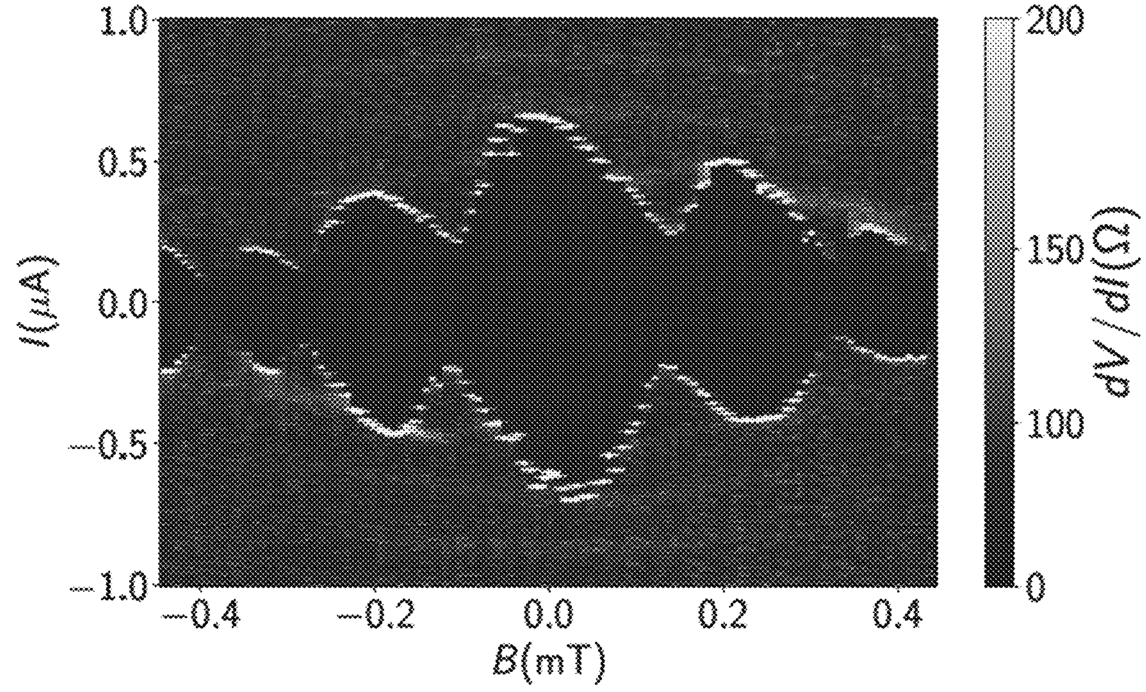
FIG. 7A is a color map of device resistance as function of bias current and B, with terminal 2 as a source and terminal 0 as a drain.
Figure 7B:
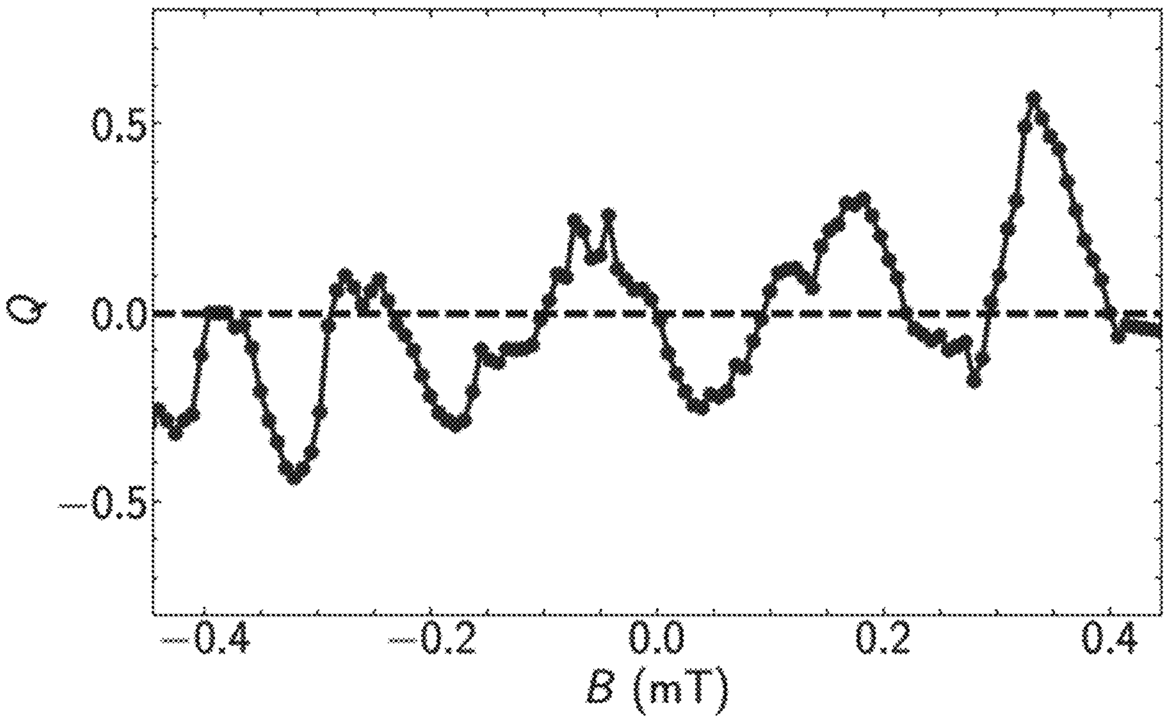
FIG. 7B is a chart illustrating diode efficiency for the device of FIG. 7A.

The diode polarity may be reversible, for example, by selecting alternative terminal pairs as source and drain terminals. For example, the source terminal may be terminal 2 and the drain terminal may be terminal 0. In this case $I_1=0$, $I_2=I$, $V_2=V$. The Fraunhofer-like interference lobes are tilted in the opposite direction, as seen in FIG. 7A. For B just above just zero the Q<0 as seen in FIG. 7B (compared to the case of terminal 1 being source where Q>0 for B just above 0). Such behavior is consistent with the network model. Thus, for a given field, the diode efficiency and polarity can be tuned by electrostatic gating. For example, complete gate tunability of a Josephson diode's efficiency and polarity may be attained by changing supercurrent distribution, providing further control of this effect.

In some examples according to the present disclosure, a device 10 (for example, as shown in FIG. 1B) includes a Josephson junction 13 between at least three terminals 15. Terminals 15 may include one or more of epitaxial aluminum, Sn, Nb, MoRe, superconducting van der Waals materials, or any other superconducting material.

Josephson junction 13 may define a Y-shape, for example, between three terminals. Josephson junction 13 may define an X-shape or a cross-shape, for example, between four terminals. Generally, Josephson junction 13 may define an n-pointed star for n terminals.

Device 10 is configured to exhibit a superconducting diode effect. For example, in response to a bias, superconducting current may flow in a first direction between a terminal pair of at least three terminals, and a dissipative current may flow in a second direction opposite to the first direction.

Device 10 may further include at least one gate 24 across a terminal pair of at least three terminals 15. The terminal pair may include any immediately neighboring terminals (for example, terminals defining a channel therebetween) of at least three terminals 15. In some examples, gate 24 is configured to be magnetically or electrostatically tunable.

At least one gate 24 may include at least two gates, three gates, more than three gates, or exactly three gates. At least one gate 24 may include four, five, six, seven, eight, nine, ten, or more gates. In some examples, the number of gates 24 is the same as the number of terminals 15. In other examples, the number of gates 24 is less than the number of terminals 15. In some examples, each gate is independently tunable, for example, magnetically and/or electrostatically tunable. The gates 24 and the ungated region between terminals may provide independent control of coupling between terminals.

In some examples, each gate of three gates 24 is positioned across a respective channel 17 defined between a respective terminal pair of at least three terminals 15. In some examples, channel 17 defines a maximum spacing up to a coherence length of a material between the terminal pair. For example, channel 17 may define a maximum spacing between terminals 15 from a few nanometers to a few microns, depending on the phase-coherence length of a material in channel 17. Channels 17 may collectively define a Y-shape, for example, between three terminals 15. Channels 17 may define an X-shape or a cross-shape, for example, between four terminals 15. Generally, channels 17 may define an n-pointed star for n terminals. Channels 17 may be symmetrically positioned about a geometric center of Josephson junction 13, substantially equal in length, or substantially in width, or may be asymmetrically positioned, or differ in length or width. Channels 17 may be occupied by one or more conducting materials, for example, a metal, an alloy, a weaker superconductor or a semiconductor, a thin insulator (for example, such as in Al—AlOx Josephson devices used in superconducting qubits), or any other material that supports Josephson coupling across channel 17.

In some examples, at least three terminals 15 includes no more than three terminals. Thus, device 10 may include exactly three terminals, and no more than three terminals.

In some examples, a Josephson layer 22 (which may be the same as layer 22, or an aluminum epitaxial layer, or any other suitable epitaxial layer) may define Josephson junction 13. In some examples, Josephson layer 22 includes epitaxial aluminum, non-epitaxial aluminum, Sn, Nb, MoRe, or any other superconducting material.

In some examples, Josephson layer 22 may ultimately be supported by a substrate layer, for example, layer 12. One or more intervening layers may be present between Josephson layer 22 and substrate layer 12. Layer 12 may include indium phosphide (InP), or any other suitable composition. For example, layer 12 may include a metal or an alloy.

Device 10 may further include at least one layer between substrate layer 12 and Josephson layer 22. In some examples, the at least one layer may include one or more of top InGaAs barrier layer 16, a middle InAs quantum well 20, and a bottom InGaAs barrier layer 20. In some examples, the at least one layer further includes buffer layer 14.

Device 10 may further include a gate layer 28 including three gates 24. Each gate 24 may include titanium and gold. Josephson layer 22 may be between gate layer 28 and substrate layer 12, and one or more intervening layers may be present between gate layer 28 and Josephson layer 22.

In some examples, gate layer 28 includes dielectric layer 26 supporting the three (or more than three) gates 24. For example, dielectric layer 26 may include $Al_2O_3$. In some examples, dielectric layer 26 is substantially continuous.

In some examples according to the present disclosure, device 10 includes a substrate layer (for example layer 12), an epitaxial aluminum layer (for example, layer 22), and a gate layer (for example, layer 28). The epitaxial aluminum layer may include three terminals (for example, terminals 15) defining a Josephson junction (for example, terminal 13).

Gate layer 28 may include three gates 24. For example, gate layer 28 may include more than three gates, or no more than three gates. The epitaxial aluminum layer may be between gate layer 28 and substrate layer 12 such that each gate of three gates 24 extends across a respective channel 17 between a respective terminal pair of three terminals 15.

Device 10 may be configured to conduct a superconducting current in a first direction between two terminals of three terminals 15. Device 10 may be configured to conduct a dissipative current in a second direction opposite the first direction between the two terminals.

In some examples, a system may include any device according to the present disclosure. For example, as shown in FIG. 1B, a system 100 may include a device (for example, device 10), and a field generator 30 configured to generate an out-of-plane magnetic field. The magnetic field may have a field strength in a range up to a critical field of a superconductor. For example, the magnetic field may be in a range from 0 to 20 mT for aluminum-based materials, but as high as a few Teslas depending on the critical magnetic field of superconducting material used. For example, the device may include a Josephson junction between at least three terminals. System 100 may be configured to tune a diode efficiency of the device.

Figure 8:
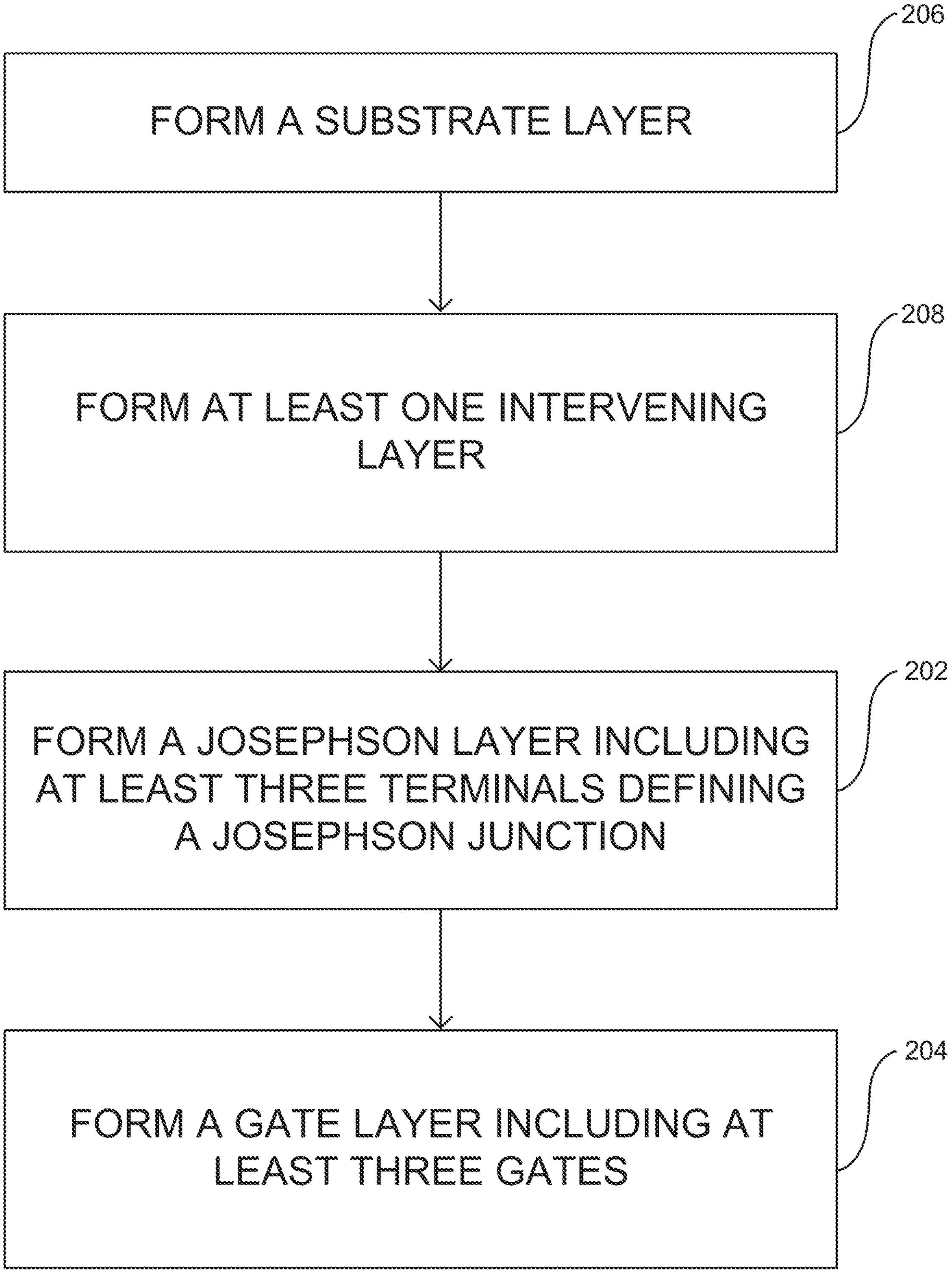
FIG. 8 is a flowchart illustrating a technique for forming a Josephson device.

FIG. 8 is a flowchart illustrating a method for forming a Josephson device. In some examples according to the present disclosure, the method includes forming a Josephson layer including three terminals defining a Josephson junction (202). The method further includes forming, over the Josephson layer, a gate layer including at least three gates (204). Each gate of the at least three gates extends across a respective channel between a respective terminal pair of the three terminals. The Josephson layer is configured to exhibit a superconducting diode effect.

Forming the Josephson layer may include forming the Josephson layer over the substrate layer. The method may further include forming, before forming the Josephson layer, the substrate layer (206). For example, the Josephson layer may be formed directly over the substrate layer, or over an intervening layer between the substrate layer and the Josephson layer. The method may further include forming at least one intervening layer between the Josephson layer and the substrate layer (208). For example, the at least one layer may be formed before the Josephson layer, or directly in contact with the substrate layer.

One or more layers may be formed by lithography, for example, electron beam lithography (EBL), wet etching techniques, or thermal atomic layer deposition (ALD). For example, a Josephson layer may be fabricated by EBL and wet etching. A dielectric layer supporting gates over the Josephson layer may be fabricated by ALD. EBL may further be used to deposit gates, and gate electrodes may be deposited using electron-beam evaporation of Ti/Au (for example, 5 nm/25 nm). Further lithography may be used to deposit thicker gold contacts (Ti/Au, for example, 5 nm/200 nm) to the gate electrodes.

Devices and systems according to the present disclosure may provide compact, yet scalable and robust approach to realize the Josephson diode effect at practically zero field (for example, smaller in magnitude than the Earth's natural field) and achieve a gate-tunable Josephson device with unconventional CφR. The multi-terminal Josephson diode effect depends only on the multi-terminal nature of the device and could thus be integrated with other materials platforms, including those typically used in superconducting qubits. Multi-terminal Josephson devices made from materials with conventional CφR could more broadly realize unconventional physics, such as semi-classical topologically-protected states.

Devices and systems according to the present disclosure may be drivable into an effective two-terminal regime by selectively gating two of the junction legs, where the diode effect is absent. Inversion symmetry breaking, for realizing non-reciprocal critical currents, is achieved by the presence of the third terminal. No reliance may be required for specific material properties, or on an imbalance of self-inductances in devices requiring large critical currents. Gate-tuning of the diode efficiency (magnitude and sign) may be attainable by modifying $J_c(x)$.

Without being bound by theory, Q can be further increased by the addition of more terminals, which would lead to the generation of higher harmonics in the CφR. If, in addition, using materials that can intrinsically realize higher harmonics may further enhance Q.

Aspects

- Aspect 1: A device including a Josephson junction between at least three terminals, where the device is configured to exhibit a superconducting diode effect.
- Aspect 2: The device of aspect 1, further including at least one gate across a terminal pair of the at least three terminals.
- Aspect 3: The device of aspect 2 or 3, where the at least one gate is configured to be magnetically or electrostatically tunable.
- Aspect 4: The device of aspect 2 or 3, where the at least one gate includes three gates, each gate of the three gates positioned across a respective channel defined between a respective terminal pair of the at least three terminals.

Aspect 5: The device of aspect 4, where the device includes no more than three terminals.

Aspect 6: The device of aspect 5, where the Josephson junction defines a Y-shape.

Aspect 7: The device of aspect 6, further including a Josephson layer comprising the at least three terminals, and further including a substrate layer spaced from the at least three terminals.

Aspect 8: The device of aspect 7, where the Josephson layer includes epitaxial aluminum.

Aspect 9: The device of aspect 7 or 8, where the substrate layer includes indium phosphide.

Aspect 10: The device of any of aspects 7 to 9, where the substrate layer includes a metal or an alloy.

Aspect 11: The device of any of aspects 7 to 11, further including at least one layer between the substrate layer and the Josephson layer.

Aspect 12: The device of aspect 11, where the at least one layer includes a top InGaAs barrier layer, a middle InAs quantum well, and a bottom InGaAs barrier layer.

Aspect 13: The device of any of aspects 7 to 12, further including a gate layer including the three gates, where the Josephson layer is between the gate layer and the substrate layer.

Aspect 14: The device of aspect 13, where the gate layer includes a continuous dielectric layer supporting the three gates.

Aspect 15: The device of aspect 14, where the continuous dielectric layer includes $Al_2O_3$, and where the three gates each include titanium and gold.

Aspect 16: A device including: a substrate layer; an epitaxial aluminum layer including three terminals defining a Josephson junction; and a gate layer including three gates, where the epitaxial aluminum layer is between the gate layer and the substrate layer such that each gate of the three gates extends across a respective channel between a respective terminal pair of the three terminals, where the device is configured to conduct a superconducting current in a first direction between two terminals of the three terminals, and where the device is configured to conduct a dissipative current in a second direction opposite the first direction between the two terminals.

Aspect 17: A system including: the device of any of aspects 1 to 16; and a field generator configured to generate an out-of-plane magnetic field and tune a diode efficiency of the device.

Aspect 18: A method including: forming a Josephson layer including at least three terminals defining a Josephson junction; and forming, over the Josephson layer, a gate layer including at least three gates such that each gate of the at least three gates extends across a respective channel between a respective terminal pair of the three terminals, where the Josephson layer and the gate layer are configured to exhibit a superconducting diode effect.

Aspect 19: The method of aspect 18, further including forming a substrate layer, where forming the Josephson layer includes forming the Josephson layer over the substrate layer.

Aspect 20: The method of aspect 19, further including forming at least one intervening layer between the Josephson layer and the substrate layer.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

What is claimed is:

1. A device comprising:

a Josephson junction between at least three terminals; and at least two gates, each gate of the at least two gates being positioned across a respective channel defined between a respective terminal pair of the at least three terminals, wherein the device is configured to exhibit a superconducting diode effect.

2. The device of claim 1, wherein the device is configured to reverse a diode polarity in response to one or both of a predetermined gate voltage or a predetermined magnetic field.

3. The device of claim 1, wherein at least one gate of the at least two gates is configured to magnetically or electrostatically tune the device.

4. The device of claim 1, wherein the at least two gates comprise three gates.

5. The device of claim 1, wherein the device comprises no more than three terminals of the Josephson junction.

6. The device of claim 1, wherein the Josephson junction defines a Y-shape.

7. The device of claim 6, further comprising a Josephson layer comprising the at least three terminals, and further comprising a substrate layer spaced from the at least three terminals.

8. The device of claim 7, wherein the Josephson layer comprises epitaxial aluminum.

9. The device of claim 7, wherein the substrate layer comprises indium phosphide.

10. The device of claim 7, wherein the substrate layer comprises a metal or an alloy.

11. The device of claim 7, further comprising at least one layer between the substrate layer and the Josephson layer.

12. The device of claim 11, wherein the at least one layer comprises a top InGaAs barrier layer, a middle InAs quantum well, and a bottom InGaAs barrier layer.

13. The device of claim 7, further comprising a gate layer comprising the at least two gates, wherein the Josephson layer is between the gate layer and the substrate layer.

14. The device of claim 13, wherein the gate layer comprises a continuous dielectric layer supporting the at least two gates.

15. The device of claim 14, wherein the continuous dielectric layer comprises $Al_2O_3$, and wherein the at least two gates each comprise titanium and gold.

16. A system comprising:

a device comprising:

a Josephson junction between at least three terminals; and at least two gates, each gate of the at least two gates being positioned across a respective channel defined between a respective terminal pair of the at least three terminals, wherein the device is configured to exhibit a superconducting diode effect; and a field generator configured to generate a magnetic field and tune a diode efficiency of the device.

17. A device comprising:

a substrate layer;

an epitaxial aluminum layer comprising three terminals defining a Josephson junction; and a gate layer comprising three gates, wherein the epitaxial aluminum layer is between the gate layer and the substrate layer such that each gate of the three gates extends across a respective channel between a respective terminal pair of the three terminals, wherein the device is configured to conduct a superconducting current in a first direction between two terminals of the three terminals, and wherein the device is configured to conduct a dissipative current in a second direction opposite the first direction between the two terminals.

18. A method comprising:

forming a Josephson layer comprising at least three terminals defining a Josephson junction; and forming, over the Josephson layer, a gate layer comprising at least three gates such that each gate of the at least three gates extends across a respective channel between a respective terminal pair of the three terminals, wherein the Josephson layer and the gate layer are configured to exhibit a superconducting diode effect.

19. The method of claim 18, further comprising forming a substrate layer, wherein forming the Josephson layer comprises forming the Josephson layer over the substrate layer.

20. The method of claim 19, further comprising forming at least one intervening layer between the Josephson layer and the substrate layer.

* * * * *